United States Patent
Lee et al.

(10) Patent No.: US 12,369,464 B2
(45) Date of Patent: Jul. 22, 2025

(54) DISPLAY DEVICE

(71) Applicant: Samsung Display Co., LTD., Yongin-si (KR)

(72) Inventors: Jae Hyun Lee, Gwacheon-si (KR); Seul-Ki Kim, Incheon (KR); Seung Rae Kim, Cheonan-si (KR); Kwang Soo Lee, Gwangmyeong-si (KR); Ki Su Jin, Cheonan-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 310 days.

(21) Appl. No.: 17/325,729

(22) Filed: May 20, 2021

(65) Prior Publication Data

US 2022/0102464 A1    Mar. 31, 2022

(30) Foreign Application Priority Data

Sep. 29, 2020    (KR) .................. 10-2020-0126976

(51) Int. Cl.
  *H10K 59/131*    (2023.01)
  *H10K 50/844*    (2023.01)
  *H10K 59/80*     (2023.01)

(52) U.S. Cl.
  CPC ......... *H10K 59/131* (2023.02); *H10K 50/844* (2023.02); *H10K 59/87* (2023.02)

(58) Field of Classification Search
  CPC ..... H10K 59/131; H10K 59/87; H10K 50/844
  See application file for complete search history.

(56) References Cited

U.S. PATENT DOCUMENTS

| | | | |
|---|---|---|---|
| 2013/0050173 A1* | 2/2013 | Koo | G02F 1/136204 345/212 |
| 2014/0159000 A1* | 6/2014 | Kang | H10K 50/8445 257/40 |
| 2019/0067409 A1* | 2/2019 | Shin | H10D 89/811 |
| 2019/0348491 A1 | 11/2019 | Chung et al. | |
| 2020/0203641 A1* | 6/2020 | Lee | G02F 1/133305 |
| 2020/0203653 A1* | 6/2020 | Um | H10D 86/443 |
| 2022/0344439 A1* | 10/2022 | Zhang | H10K 59/131 |

FOREIGN PATENT DOCUMENTS

| | | |
|---|---|---|
| KR | 10-2014-0073200 | 6/2014 |
| KR | 10-2017-0002790 | 1/2017 |
| KR | 10-2017-0142232 | 12/2017 |
| KR | 10-2019-0130092 | 11/2019 |
| KR | 10-2020-0048797 | 5/2020 |

* cited by examiner

*Primary Examiner* — Vongsavanh Sengdara
(74) *Attorney, Agent, or Firm* — KILE PARK REED & HOUTTEMAN PLLC

(57) ABSTRACT

A display device includes a substrate including a display area and a non-display area, a light-emitting element disposed in the display area, and a common voltage supply line disposed in the non-display area and electrically connected to the light-emitting element. The common voltage supply line includes at least two main supply lines, a sub-supply line for connecting the at least two main supply lines, and at least one anti-static pattern disposed outside the sub-supply line in a plan view.

24 Claims, 19 Drawing Sheets

DISPLAY DEVICE

CROSS-REFERENCE TO RELATED APPLICATION(S)

This application claims priority to and benefits of Korean Patent Application No. 10-2020-0126976 under 35 U.S.C. § 119, filed in the Korean Intellectual Property Office on Sep. 29, 2020, the entire contents of which are incorporated herein by reference.

BACKGROUND

1. Technical Field

The disclosure relates to a display device.

2. Description of the Related Art

An emissive display device has a wide viewing angle, excellent contrast, and a fast response speed, so it has recently been used in various types of display devices.

In general, the emissive display device has thin film transistors and light-emitting elements on a substrate, and the light-emitting elements emit light in operation. The emissive display device may be used as a display unit of small-sized products such as mobile phones, or a display unit of large-sized products such as televisions or monitors.

The emissive display device may include a display area in which pixels may be disposed and a non-display area that may be a peripheral region of the display area. The non-display area of the emissive display device may be formed along an edge of the substrate, so structures for preventing permeation of external moisture may be disposed.

The above information disclosed in this Background section is only for enhancement of understanding of the background of the disclosure, and therefore it may contain information that does not form the prior art that is already known in this country to a person of ordinary skill in the art.

SUMMARY

The disclosure has been made in an effort to provide a display device including a signal wire for preventing external permeation of moisture in a non-display area.

An embodiment of the disclosure provides a display device that may include a substrate including a display area and a non-display area, a light-emitting element disposed in the display area, and a common voltage supply line disposed in the non-display area and electrically connected to the light-emitting element. The common voltage supply line may include at least two main supply lines, a sub-supply line for connecting the at least two main supply lines, and at least one anti-static pattern disposed outside the sub-supply line in a plan view.

The at least one anti-static pattern may include a plurality of anti-static patterns, and the plurality of anti-static patterns may be disposed in a first direction.

The plurality of anti-static patterns may be spaced apart from each other.

The common voltage supply line may include a connection bridge electrically connected to a common electrode of the light-emitting element.

The connection bridge may be electrically connected to the sub-supply line and the plurality of anti-static patterns.

Each of the sub-supply line and the at least one anti-static pattern may include an expansion connected to the connection bridge.

The at least two main supply lines may be spaced in the first direction, and the sub-supply line may extend in the first direction and may electrically connect the at least two main supply lines.

The display device may further include a buffer layer, an inter-layer insulating layer, a first insulating layer, and a second insulating layer sequentially disposed on the substrate, wherein the first insulating layer may form a valley between the main supply line and the anti-static pattern, and the second insulating layer may fill the valley.

The display device may further include a first region overlapping the main supply line, the sub-supply line, and the anti-static pattern, and a second region, wherein the first region may not overlap the second insulating layer.

The connection bridge may overlap the second insulating layer in the second region.

The sub-supply line may include at least one of a first sub-supply line between the substrate and the buffer layer, a second sub-supply line between the buffer layer and the inter-layer insulating layer, and a third sub-supply line between the inter-layer insulating layer and the first insulating layer.

The display device may further include a metal layer disposed on the substrate, a gate electrode disposed on the buffer layer, and a source electrode and a drain electrode disposed on the inter-layer insulating layer. The first sub-supply line and the metal layer may be disposed on a same layer, the second sub-supply line and the gate electrode may be disposed on a same layer, and the third sub-supply line, the source electrode, and the drain electrode may be disposed on a same layer.

Another embodiment of the disclosure provides a display device that may include a substrate including a display area and a non-display area, a light-emitting element disposed in the display area and electrically connected to a thin film transistor, an insulating layer between the substrate and the light-emitting element, and a common voltage supply line disposed in the non-display area and electrically connected to the light-emitting element. The common voltage supply line may include a main supply line, a sub-supply line electrically connected to the main supply line, and at least one anti-static pattern disposed outside the sub-supply line in a plan view, and the insulating layer may be spaced from the main supply line, the sub-supply line, and the at least one anti-static pattern in a plan view.

The insulating layer may not overlap the main supply line, the sub-supply line, and the at least one anti-static pattern.

The common voltage supply line may include a connection bridge electrically connected to a common electrode of the light-emitting element.

The connection bridge may be electrically connected to the sub-supply line and the plurality of anti-static patterns.

The common voltage supply line may include at least two main supply lines spaced in a first direction and extending in a second direction that may be perpendicular to the first direction, and a sub-supply line extending in the first direction and electrically connecting the at least two main supply lines.

The display device may further include a buffer layer, an inter-layer insulating layer, a first insulating layer, and a second insulating layer sequentially disposed on the substrate, wherein the sub-supply line may include at least one of a first sub-supply line between the substrate and the buffer layer, a second sub-supply line between the buffer layer and the inter-layer insulating layer, and a third sub-supply line between the inter-layer insulating layer and the first insulating layer.

The connection bridge may be disposed at a layer higher than the sub-supply line.

According to embodiments, the display device with the excellent effect of preventing the permeation of moisture in the non-display area may be provided.

DETAILED DESCRIPTION OF THE EMBODIMENTS

Figure 1:
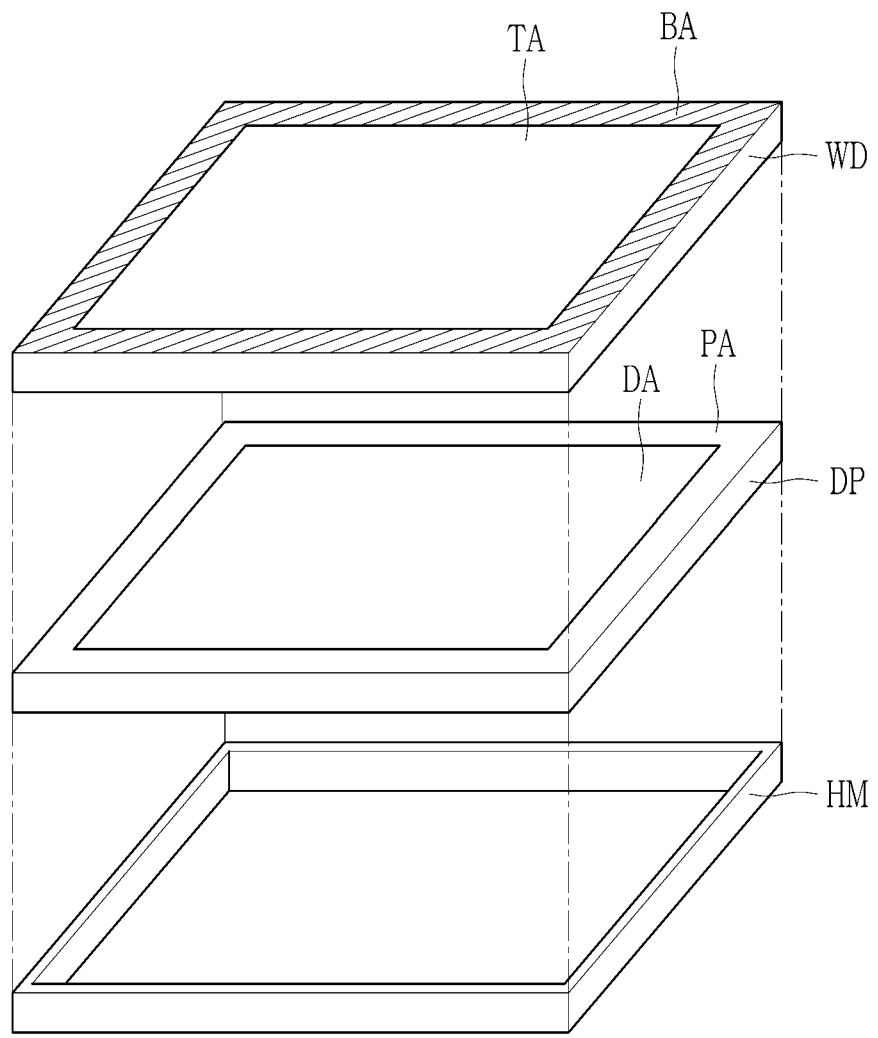
FIG. 1 schematically shows an exploded perspective view of a display device according to an embodiment.

The disclosure will be described more fully hereinafter with reference to the accompanying drawings, in which embodiments of the disclosure are shown. As those skilled in the art would realize, the described embodiments may be modified in various different ways, all without departing from the spirit or scope of the disclosure.

Accordingly, the drawings and description are to be regarded as illustrative in nature and not restrictive.

Like reference numerals designate like elements throughout the specification.

The size and thickness of each component illustrated in the drawings may be arbitrarily illustrated in the drawings for better understanding and ease of description, but the disclosure is not limited to the illustrations. In the drawings, the thickness of layers, films, panels, regions, etc., may be exaggerated for clarity. The thicknesses of some layers and areas may be exaggerated for convenience of explanation.

It will be understood that when an element such as a layer, film, region, or substrate is referred to as being "on" another element, it can be directly on the other element or intervening elements may also be present. In contrast, when an element is referred to as being "directly on" another element, there may be no intervening elements present. Further, in the specification, the word "on" or "above" means disposed (e.g., positioned) on or below the object portion, and does not necessarily mean positioned on the upper side of the object portion based on a gravitational direction.

Unless explicitly described to the contrary, the words "comprise", "has", "have", and "include", and variations thereof, will be understood to imply the inclusion of stated elements but not the exclusion of any other elements.

As used herein, the singular forms, "a," "an," and "the" are intended to include the plural forms as well (and vice versa), unless the context clearly indicates otherwise.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

In the specification and the claims, the phrase "at least one of" is intended to include the meaning of "at least one selected from the group of" for the purpose of its meaning and interpretation. For example, "at least one of A and B" may be understood to mean "A, B, or A and B."

Further, throughout the specification, the phrase "in a plan view" means viewing a target portion from the top, and the phrase "in a cross-sectional view" means viewing a cross-section formed by vertically cutting a target portion from the side.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art. When an element is described as to "not overlap" another element, this may include that the elements are spaced apart from each other, offset from each other, or set aside from each other or any other suitable term as would be appreciated and understood by those of ordinary skill in the art.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined or implied, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
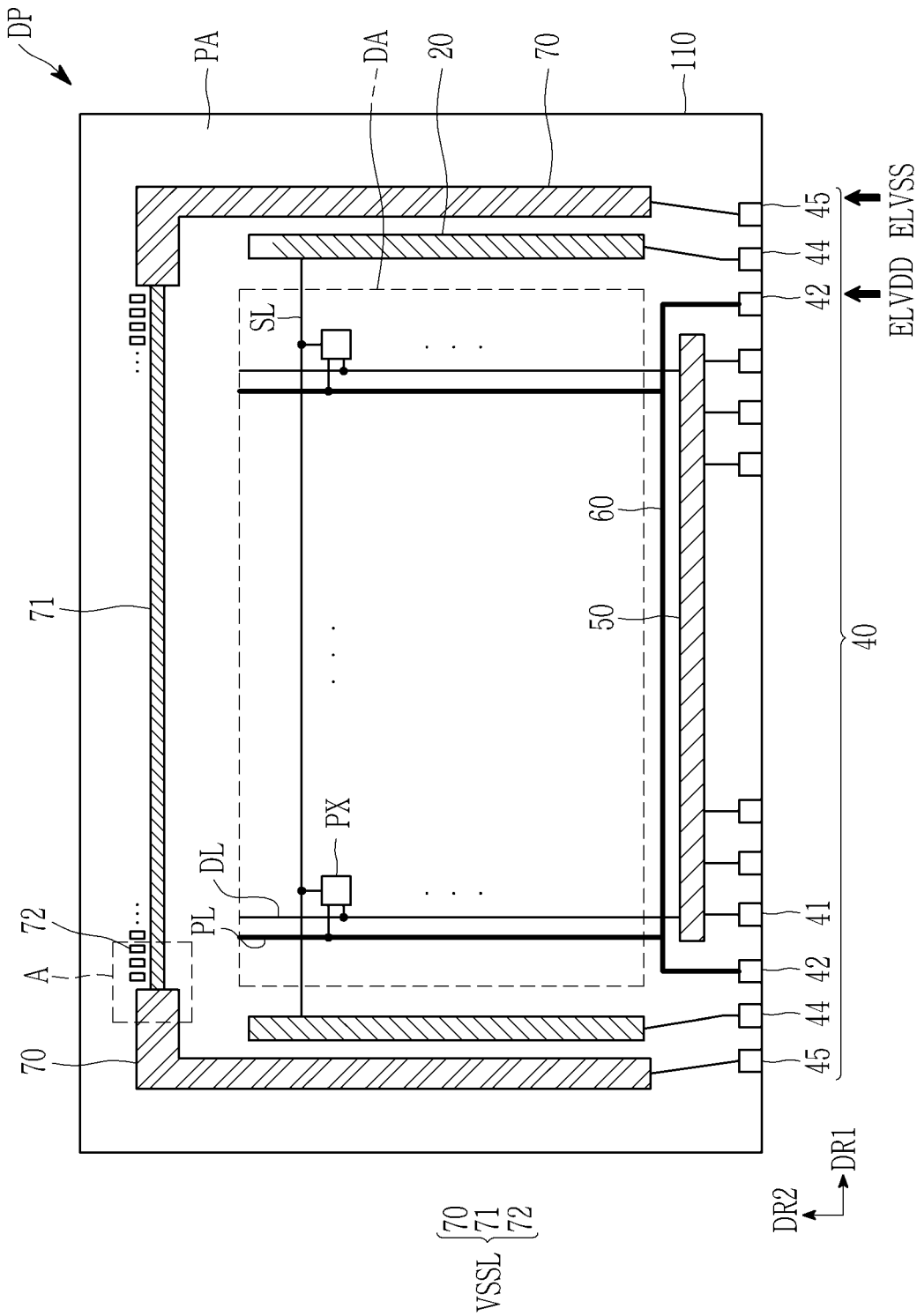
FIG. 2 schematically shows a top plan view of a display panel according to an embodiment.

FIG. 1 schematically shows an exploded perspective view of a display device according to an embodiment, and FIG. 2 schematically shows a top plan view of a display panel according to an embodiment.

Referring to FIG. 1, the display device may include a display panel DP, a window WD, and a housing HM.

A side of the display panel DP on which the image may be displayed may be parallel to a side defined by a first direction DR1 and a second direction DR2. A normal direction of the side on which the image may be displayed, for example, a thickness direction of the display panel DP, is indicated by a third direction DR3. Front sides (or upper sides) and rear sides (or lower sides) of respective members may be distinguished by the third direction DR3. However, the direction indicated by the first to third directions DR1, DR2, and DR3 are relative concepts, and may be converted into other directions.

The display panel DP may be a flat rigid display panel, but it is not limited thereto, and it may be a flexible display panel. The display panel DP according to an embodiment may be an emissive display panel, and it is not specifically limited thereto. For example, the display panel DP may be an organic light emitting panel or a quantum dot light emitting display panel. An emission layer of the organic light emitting panel may include an organic light emitting material. An emission layer of the quantum dot light emitting display panel may include a quantum dot and a quantum rod. The display panel DP will be described as an organic light emitting panel.

As shown in FIG. 1, the display panel DP may include a display area DA for displaying an image, and a non-display area PA provided near the display area DA. The non-display area PA may represent a region for not displaying images. The display area DA may, for example, have a quadrangular shape, and the non-display area PA may have a shape surrounding the display area DA. However, without being limited thereto, the shapes of the display area DA and the non-display area PA may be relatively designed.

The window WD may be positioned on the display panel DP. The window WD may protect the display panel DP. The window WD may be combined to the housing HM to form an inner space. The window WD and the housing FIM may define the appearance of the display device.

The window WD may include a transmission area TA and a blocking area BA. The transmission area TA may be a region for transmitting most of incident light. The transmission area TA may have optical transparency. The transmission area TA may have light transmittance of about 90% or more. The transmission area TA may overlap the display area DA of the display panel DP.

The blocking area BA may be a region for blocking most of incident light. The blocking area BA may prevent configurations disposed on a lower portion of the window WD from being visible. Further, the blocking area BA may reduce reflection of light input from the outside of the window WD. The blocking area BA may overlap the non-display area PA of the display panel DP.

The housing HM may provide an inner space. The display panel DP may be installed inside the housing HM. Various electronic parts, for example, a power supply, a storage device, and a sound input and output module in addition to the display panel DP may be installed in the housing HM.

Referring to FIG. 2, the display panel DP may include a display area DA and a non-display area PA. The non-display area PA may be defined along an edge of the display area DA.

The display panel DP may include pixels PX. The pixels PX may be disposed in the display area DA of the substrate 110. The pixels PX may respectively include an organic light emitting diode and a pixel driving circuit connected thereto.

The respective pixels PX may emit, for example, red light, green light, blue light, or white light, and may, for example, include an organic light emitting diode. The display panel DP may provide an image through light emitted by the pixels PX, and the display area DA may be defined by the pixels PX. In the specification, the non-display area PA may be a region in which the pixels PX may not be disposed, and the region may display no images.

The display panel DP may include signal lines and a pad portion. The signal lines may include a scan line SL extending in the first direction DR1, and a data line DL and a driving voltage line PL extending in the second direction DR2.

The scan driver 20 may be positioned in the non-display area PA on the substrate 110. The scan driver 20 may generate a scan signal and transmit the same to the pixels PX through the scan line SL. According to an embodiment, the scan driver 20 may be disposed on a right side and a left side of the display area DA. The specification illustrates a configuration in which the scan driver 20 may be disposed on respective sides of the display area DA, and as another embodiment, the scan driver may be disposed on one side of the display area DA.

The pad portion 40 may be disposed on one end of the display panel DP, and may include terminals 41, 42, 44, and 45. The pad portion 40 may not be covered by an insulating layer but may be exposed, so that the pad portion 40 may be electrically connected to a controller (not shown) such as a flexible printed circuit board or an IC chip.

The controller may transform image signals into image data signals, and transmit the image data signals to the data driver 50 through the terminal 41. The controller may receive a vertical synchronization signal, a horizontal synchronizing signal, and a clock signal, may generate a control signal for controlling the scan driver 20 and the data driver 50, and may transmit it to the terminals 44 and 41. The controller may transmit a driving voltage ELVDD to a driving voltage supply line 60 through the terminal 42. The controller also may transmit a common voltage ELVSS to a common voltage supply line VSSL through the terminal 45.

The data driver 50 may be disposed in the non-display area PA. The data driver 50 may generate a data signal and transmit the data signal to the pixels PX through the data line DL. The data driver 50 may be disposed on a side of the display panel DP, and for example, it may be disposed between the pad portion 40 and the display area DA.

The driving voltage supply line 60 may be disposed in the non-display area PA. For example, the driving voltage supply line 60 may be disposed between the data driver 50 and the display area DA. The driving voltage supply line 60 may provide the driving voltage ELVDD to the pixels PX. The driving voltage supply line 60 may be disposed in the first direction DR1, and may be connected to driving voltage lines PL disposed in the second direction DR2.

The common voltage supply line VSSL may be disposed in the non-display area PA, and provide a common voltage ELVSS to the common electrode 270 (refer to FIG. 8) of the organic light emitting element of the pixel PX. The common voltage supply line VSSL may form a closed loop extending from a lateral side of the substrate 110 and surrounding three sides along an edge of the substrate 110.

The common voltage supply line VSSL may include a main supply line 70, a sub-supply line 71, and an anti-static pattern 72. The common voltage supply line VSSL positioned in the non-display area PA of FIG. 2 will now be described with reference to FIG. 3 to FIG. 8.

Figure 3:
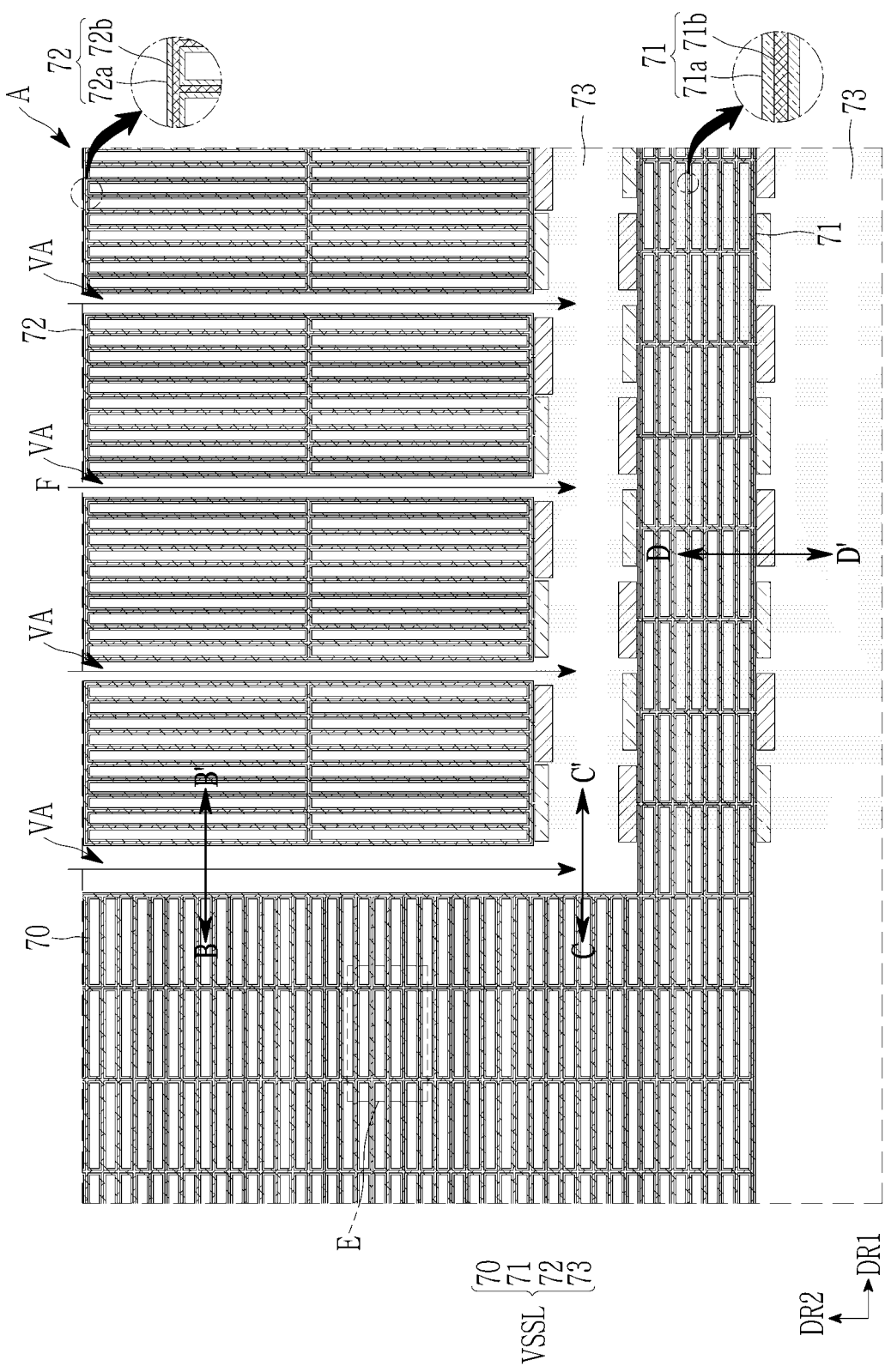
FIG. 3 schematically shows a top plan view enlarging region A of FIG. 2.
Figure 4:
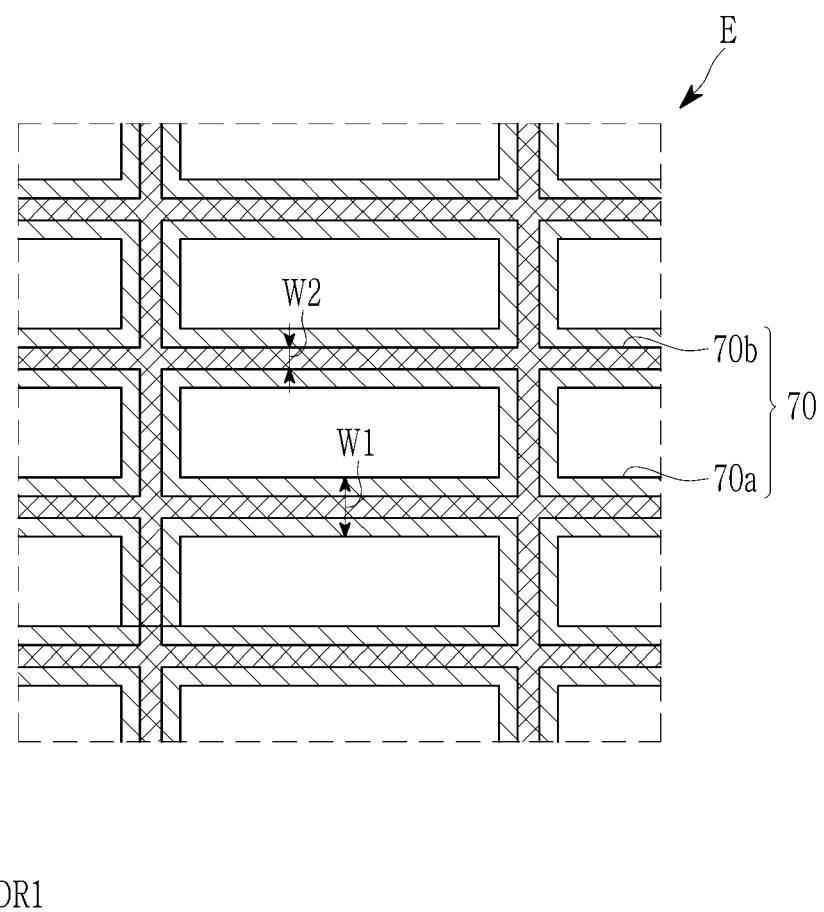
FIG. 4 schematically shows a top plan view enlarging region E of FIG. 3.
Figure 5:
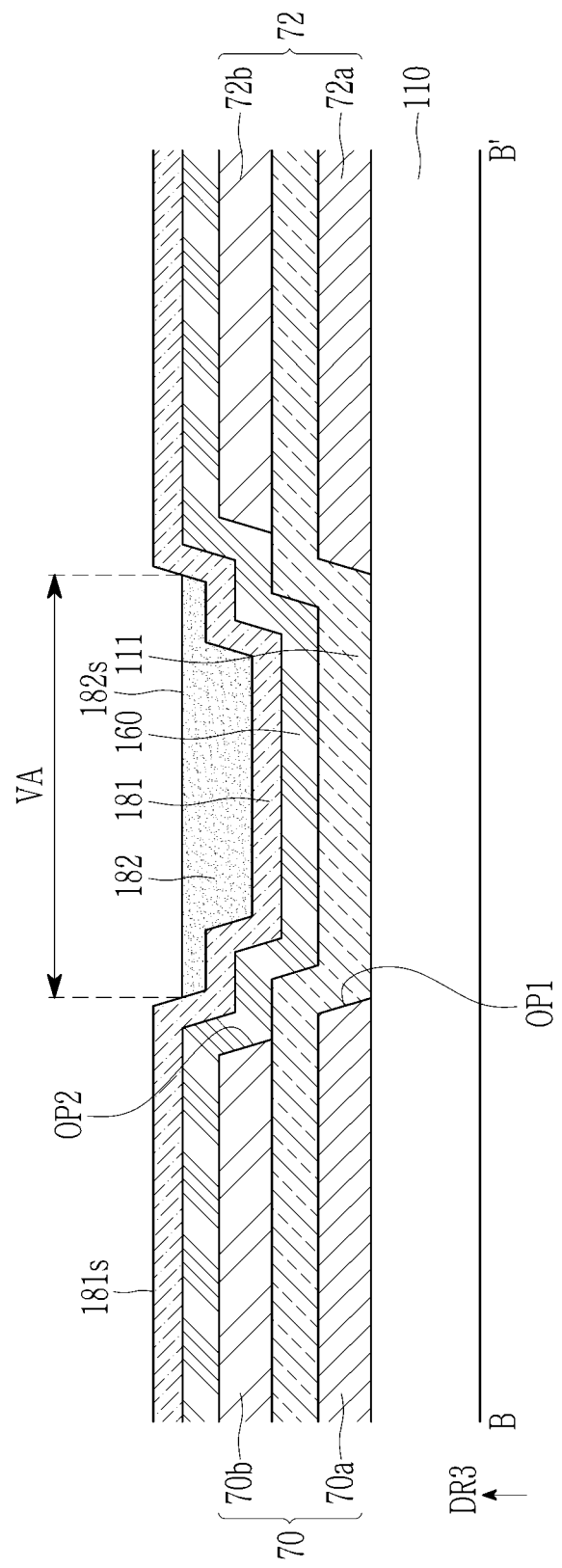
FIG. 5 schematically shows a cross-sectional view with respect to line B-B' of FIG. 3.
Figure 6:
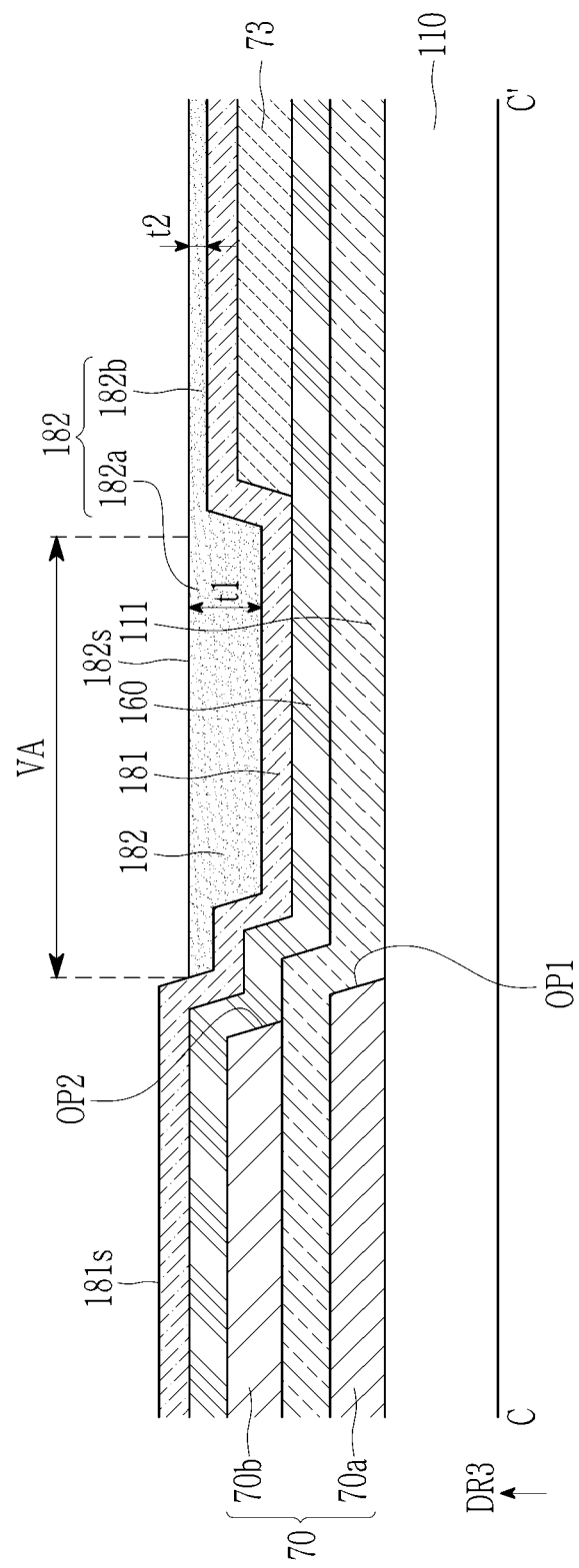
FIG. 6 schematically shows a cross-sectional view with respect to line C-C' of FIG. 3.
Figure 7:
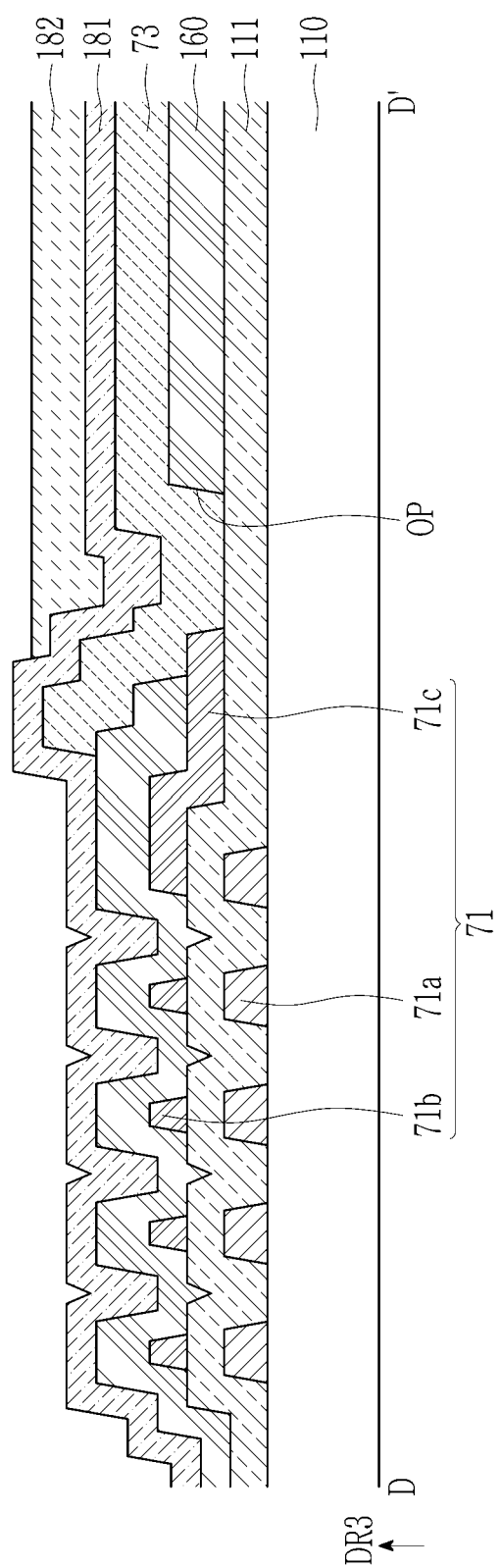
FIG. 7 schematically shows a cross-sectional view with respect to line D-D' of FIG. 3.
Figure 8:
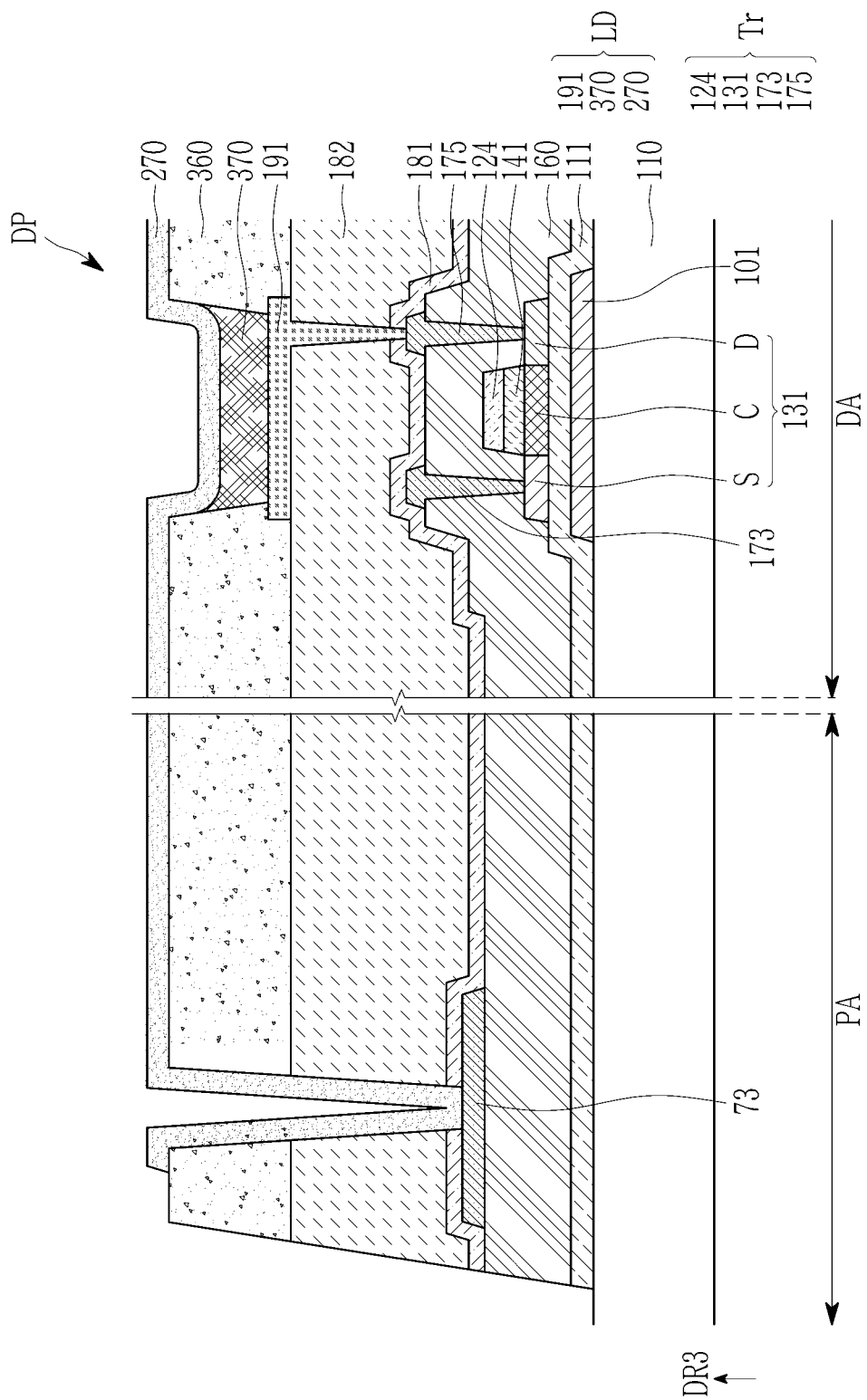
FIG. 8 schematically shows a cross-sectional view of a configuration for connecting a display area and a non-display area according to an embodiment of FIG. 7.

FIG. 3 schematically shows a top plan view enlarging region A of FIG. 2. FIG. 4 schematically shows a top plan view enlarging region E of FIG. 3. FIG. 5 schematically shows a cross-sectional view with respect to line B-B' of FIG. 3. FIG. 6 schematically shows a cross-sectional view with respect to line C-C' of FIG. 3. FIG. 7 schematically shows a cross-sectional view with respect to line D-D' of FIG. 3. FIG. 8 schematically shows a cross-sectional view of a configuration for connecting a display area and a non-display area according to an embodiment of FIG. 7.

Referring to FIG. 2 and FIG. 3, the common voltage supply line VSSL may include a main supply line 70, a sub-supply line 71 extending from the main supply line 70, an anti-static pattern 72, and a connection bridge 73.

The main supply line 70 may extend from the terminal 45 described with reference to FIG. 2 and receive the common voltage. The main supply line 70 may extend in the second direction DR2 and may be bent in the first direction DR1 from the upper portion of the substrate 110. The display device may include two main supply lines 70. The two main supply lines 70 may be respectively positioned on the right side and the left side of the substrate 110. The two main supply lines 70 may be symmetric to each other with respect to an axis in parallel to the second direction DR2.

The sub-supply line 71 may extend in the first direction DR1 and may connect at least two main supply lines 70. The sub-supply line 71 may extend from an end of the main supply line 70. The sub-supply line 71 may form a common voltage supply line VSSL in a closed loop shape by connecting at least two spaced main supply lines 70. The specification illustrates an embodiment in which the sub-supply line 71 may be a straight line, and without being limited thereto, it may have a zigzag shape or a wave shape in a plan view.

The anti-static pattern 72 may have a rectangular shape in a plan view. The common voltage supply line VSSL may include anti-static patterns 72. The anti-static patterns 72 may be disposed in the first direction DR1. The anti-static patterns 72 may be spaced from each other in a plan view. The anti-static pattern 72 may block static electricity input from the outside of the substrate 110 until a connection bridge to be described in a process for manufacturing a display device may be formed.

The connection bridge 73 may electrically connect anti-static patterns 72 and a sub-supply line 71 extending from the main supply line 70. Particularly, the connection bridge 73 may be connected to an expansion protruding in the second direction DR2 from the anti-static pattern 72, and an expansion protruding in the second direction DR2 from the sub-supply line 71. A detailed contact form will be described with respect to a cross-section. The connection bridge 73 may also connect the sub-supply line 71 and the common electrode of the light-emitting element extending to the display area DA.

The main supply line 70, the sub-supply line 71, and the anti-static pattern 72 may include a metal layer made as a double layer. The main supply line 70, the sub-supply line 71, and the anti-static pattern 72 may respectively include a first layer positioned on the substrate 110 and a second layer positioned on the buffer layer 111.

As shown in FIG. 4 and FIG. 5, the main supply line 70 may include a first main supply line 70a positioned on the substrate 110 and a second main supply line 70b positioned on the buffer layer 111.

Referring to FIG. 3, the sub-supply line 71 may include a first sub-supply line 71a positioned on the substrate 110 and a second sub-supply line 71b positioned on the buffer layer 111. The anti-static pattern 72 may include a first anti-static pattern 72a positioned on the substrate 110, and a second anti-static pattern 72b positioned on the buffer layer 111.

The main supply line 70, the sub-supply line 71, and the anti-static pattern 72 may be configured to be on substantially a same layer. The first main supply line 70a, the first sub-supply line 71a, and the first anti-static pattern 72a may be formed with a same material in a same process. The second main supply line 70b, the second sub-supply line 71b, and the second anti-static pattern 72b may be formed with a same material in a same process.

Although not shown in the specification, the first main supply line 70a and the second main supply line 70b may contact each other in a region from which part of the buffer layer 111 may be removed. The first sub-supply line 71a and the second sub-supply line 71b may contact each other in a region from which part of the buffer layer 111 may be removed. The first anti-static pattern 72a and the second anti-static pattern 72b may contact each other in a region from which part of the buffer layer 111 may be removed.

The main supply line 70, the sub-supply line 71, and the anti-static pattern 72 may respectively have a mesh shape in a plan view. The first main supply line 70a may overlap the second main supply line 70b. In case that a wire in a mesh shape may be included, a process such as exposure and curing from the rear side of the substrate 110 may be allowable through a space between the mesh in the manufacturing process.

A width W1 of one wire of the first main supply line 70a may be greater than a width W2 of one wire of the second main supply line 70b. The second main supply line 70b may completely overlap the first main supply line 70a. Part of the first main supply line 70a may overlap the second main supply line 70b. The sub-supply line 71 and the anti-static pattern 72 may include a same shape as the main supply line 70.

A valley VA may be positioned between the main supply line 70 and the anti-static pattern 72, and between two adjacent anti-static patterns 72. The valley VA represents a region in which no additional wire may be positioned. A cross-sectional shape of the valley VA will now be described.

A stacked structure indicated with line B-B' in FIG. 3 will now be described with reference to FIG. 5.

A main supply line 70 and an anti-static pattern 72 spaced from each other may be positioned on the substrate 110.

The main supply line 70 may include a first main supply line 70a positioned on the substrate 110, and a second main supply line 70b positioned on the buffer layer 111. The anti-static pattern 72 may include a first anti-static pattern 72a positioned on the substrate 110, and a second anti-static pattern 72b positioned on the buffer layer 111.

An inter-layer insulating layer 160, a first insulating layer 181, and a second insulating layer 182 may be positioned on the main supply line 70 and the anti-static pattern 72.

A valley VA may be positioned between the main supply line 70 and the anti-static pattern 72. As shown in FIG. 3, the valley VA may extend in the second direction DR2.

Opening regions OP1 and OP2 may be positioned between the main supply line 70 and the anti-static pattern 72. A buffer layer 111, an inter-layer insulating layer 160, and a first insulating layer 181 may have a stair shape and may be positioned in the opening regions OP1 and OP2. The buffer layer 111, the inter-layer insulating layer 160, and the first insulating layer 181 in a stair shape may form a valley VA. At least part of the valley VA may be filled by the second insulating layer 182. An upper side 182s of the second insulating layer 182 positioned in the valley VA may be positioned at a lower level than the upper side 181s of the first insulating layer 181.

The specification does not additionally illustrate the cross-section between anti-static patterns 72, but it may include a second insulating layer 182 disposed in the valley VA as shown by the cross-section with respect to line B-B' shown in FIG. 5. The valley VA positioned between anti-static patterns 72 may extend in the second direction DR2 as shown in FIG. 3.

Referring to FIG. 6, the main supply line 70 may include a first main supply line 70a positioned on the substrate 110, and a second main supply line 70b positioned on the buffer layer 111. The connection bridge 73 may be positioned on the buffer layer 111 and the inter-layer insulating layer 160 sequentially stacked on the substrate 110. A first insulating layer 181 and a second insulating layer 182 may be positioned on the connection bridge 73.

A valley VA may be positioned between the main supply line 70 and the connection bridge 73. The valley VA may be a region generated by extending a valley VA between the main supply line 70 and the anti-static pattern 72. A second insulating layer 182 may be positioned on at least part of the valley VA.

The second insulating layer 182 may include a first region 182a filling the valley VA, and a second region 182b positioned on the connection bridge 73. The first region 182a may be connected to the second region 182b. A thickness t1 of the first region 182a may be greater than a thickness t2 of the second region 182b.

Opening regions OP1 and OP2 may be positioned between the main supply line 70 and the connection bridge 73. A buffer layer 111, an inter-layer insulating layer 160, and a first insulating layer 181 may have a stair shape and may be positioned in the opening regions OP1 and OP2. The buffer layer 111, the inter-layer insulating layer 160, and the first insulating layer 181 in a stair shape may form a valley VA. At least part of the valley VA may be filled by the first region 182a of the second insulating layer 182.

The upper side 182s of the second insulating layer 182 corresponding to the first region 182a may be positioned at a lower level than the upper side 181s of the first insulating layer 181 positioned in the main supply line 70. The second region 182b may be positioned on the connection bridge 73 and the first insulating layer 181. The upper side 182s of the second insulating layer 182 corresponding to the second region 182b may be positioned at the higher level than the upper side 181s of the first insulating layer 181 overlapping the second region 182b. The second region 182b of the second insulating layer 182 may cover the upper side 181s of the first insulating layer 181.

Referring to FIG. 3 and FIG. 7, the sub-supply line 71 extending in the first direction DR1 may include a first sub-supply line 71a positioned on the substrate 110, and a second sub-supply line 71b positioned on the buffer layer 111.

The first sub-supply line 71a may have a mesh shape in a plan view. The second sub-supply line 71b may have a mesh shape in a plan view. The first sub-supply line 71a may overlap the second sub-supply line 71b. The second sub-supply line 71b may include an expansion 71c protruding to be electrically connected to the connection bridge 73. The expansion 71c protruded from the second sub-supply line 71b is illustrated in a cross-sectional view, but without being limited thereto, an expansion protruding from the first sub-supply line 71a may be included.

An inter-layer insulating layer 160 may be positioned on the sub-supply line 71. A connection bridge 73 may be positioned on the inter-layer insulating layer 160. The connection bridge 73 may be connected to the expansion 71c, for example, the sub-supply line 71, through the opening OP exposing the expansion 71c.

A first insulating layer 181 may be positioned on the connection bridge 73. A second insulating layer 182 may be positioned on at least part of the first insulating layer 181. The second insulating layer 182 may overlap the connection bridge 73 and may not overlap the sub-supply line 71.

Moisture permeating from the outside of the display panel may be input through a second insulating layer positioned between the adjacent main supply line 70 and the anti-static pattern 72 as marked with an arrow F in FIG. 3 or between adjacent anti-static patterns 72.

According to an embodiment, a path on which moisture may be input may be blocked by the sub-supply line 71. For example, the second insulating layer may not be positioned in the sub-supply line 71, so the path on which input moisture moves may be blocked. The inflow of moisture into the display area DA may be efficiently blocked.

Referring to FIG. 3 and FIG. 8, the sub-supply line 71 positioned in the non-display area PA and extending from the main supply line 70, and the connection bridge 73 electrically connected to the anti-static pattern 72, may be electrically connected to an end of the common electrode 270 extending from the display area DA. The common voltage ELVSS may be transmitted to the common electrode 270 of the organic light emitting element.

Regarding the display area DA shown in FIG. 8, a metal layer 101 may be positioned on the substrate 110. The metal layer 101 may overlap the semiconductor layer 131.

The metal layer 101 may prevent deterioration of a characteristic of the semiconductor layer 131 by preventing external light from reaching the semiconductor layer 131. The metal layer 101 may include, for example, a metal, a metal alloy, or a conductive material equivalent to a metal.

The metal layer 101 may receive a voltage from a region (not shown) extending from a source electrode 173 to be described. Accordingly, a current change rate may be reduced in a saturation region in a voltage-current characteristic graph of the transistor Tr, and the characteristic as a driving transistor may be improved. However, the metal layer 101 is not limited thereto, and it may be connected to another signal line or may be in a floating state.

A buffer layer 111 may be positioned on the substrate 110 and the metal layer 101. The buffer layer 111 may include a silicon nitride ($SiN_x$) or a silicon oxide ($SiO_x$).

A semiconductor layer 131 may be positioned on the buffer layer 111. The semiconductor layer 131 may include at least one of polysilicon and an oxide semiconductor. The semiconductor layer 131 may include a channel region C, a source region S, and a drain region D. The source region S and the drain region D may be disposed on respective sides of the channel region C. The channel region C may include an intrinsic semiconductor to which an impurity may not be doped, and the source region S and the drain region D may include impurity semiconductors to which a conductive impurity may be doped. The semiconductor layer 131 may be made of an oxide semiconductor, and an additional passivation layer (not shown) may be provided to protect the oxide semiconductor material that may be weak to external conditions such as a high temperature.

A gate insulating layer 141 overlapping the channel region C may be positioned on the semiconductor layer 131. The gate insulating layer 141 may be a single layer or a multilayer including at least one of silicon nitride ($SiN_x$) and silicon oxide ($SiO_x$).

A gate electrode 124 may be positioned on the gate insulating layer 141, and the gate electrode 124 may be a single layer or a multilayer on which a metal film including one or more of copper (Cu), a copper alloy, aluminum (Al), an aluminum alloy, molybdenum (Mo), and a molybdenum alloy may be stacked on each other.

An inter-layer insulating layer 160 may be positioned on the gate electrode 124 and the gate insulating layer 141. The inter-layer insulating layer 160 may include an inorganic material such as a silicon nitride ($SiN_x$), a silicon oxide ($SiO_x$), an organic material, or a combination thereof.

A source electrode 173 and a drain electrode 175 may be positioned on the inter-layer insulating layer 160. The source electrode 173 and the drain electrode 175 may be respectively connected to the source region S and the drain region D of the semiconductor layer 131 through a contact hole of the inter-layer insulating layer 160.

A first insulating layer 181 and a second insulating layer 182 may be sequentially positioned on the inter-layer insulating layer 160, the source electrode 173, and the drain electrode 175. The first insulating layer 181 may include an inorganic material such as a silicon nitride ($SiN_x$), a silicon oxide ($SiO_x$), an organic material, or a combination thereof. The second insulating layer 182 may be made of an organic material such as a polyacrylate resin or a polyimide resin, a stacked film of an organic material and an inorganic material, or an inorganic film, or a combination thereof.

A pixel electrode 191 may be positioned on the second insulating layer 182. The pixel electrode 191 may be connected to the drain electrode 175 through contact holes of the insulating layers 181 and 182.

The transistor Tr may be made of a gate electrode 124, a semiconductor layer 131, a source electrode 173, and a drain electrode 175 and may be connected to the pixel electrode 191 and supply a current to the light-emitting element LD.

A partition wall 360 may be positioned on the second insulating layer 182 and the pixel electrode 191. The partition wall 360 may include an opening overlapping at least part of the pixel electrode 191 and defining an emission region. The opening may have a substantially similar planar shape to the pixel electrode 191. The opening may have a rhombus shape in a plan view or an octagonal shape that may be similar to the rhombus, and without being limited thereto, it may have various shapes such as a quadrangle or a polygon.

The partition wall 360 may include an organic material such as a polyacrylate resin, a polyimide resin, a silica-based inorganic material, or a combination thereof.

An emission layer 370 may be positioned on the pixel electrode 191 overlapping the opening. The emission layer 370 may be made of a low-molecule organic material or a polymer organic material such as PEDOT (poly(3,4-ethylenedioxythiophene)). The emission layer 370 may be a multilayer including at least one of a hole injection layer HIL, a hole transporting layer HTL, an electron transporting layer En, and an electron injection layer EIL.

The emission layer 370 may be positioned (e.g., mostly positioned) in the opening, and may also be positioned on a side of the partition wall 360 or above the same.

A common electrode 270 may be positioned on the emission layer 370. The common electrode 270 may be positioned on multiple pixels. The common electrode 270 may extend up to the non-display area PA and may be electrically connected to the connection bridge 73 positioned in the non-display area PA, so it may receive the common voltage ELVSS.

The pixel electrode 191, the emission layer 370, and the common electrode 270 may configure a light-emitting element LD. Here, the pixel electrode 191 may be an anode that may be a hole injection electrode, and the common electrode 270 may be a cathode that may be an electron injection electrode. However, the embodiment is not limited thereto, and the pixel electrode 191 may be a cathode and the common electrode 270 may be an anode according to a method for driving an emissive display device.

Holes and electrons may be respectively injected into the organic emission layer 370 from the pixel electrode 191 and the common electrode 270, and in case that excitons that may be combinations of the injected holes and the electrons fall to the ground state from the excited state, light emission may be generated.

An encapsulation layer (not shown) may be positioned on the common electrode 270.

The encapsulation layer (not shown) may cover the upper side and the lateral side of the light-emitting element LD to seal the same. The light-emitting element may be very weak to moisture and oxygen, so the encapsulation layer (not shown) may seal the light-emitting element LD to block the inflow of external moisture and oxygen.

The encapsulation layer (not shown) may include multiple layers, may be made of a complex film including an inorganic film and an organic film from among them, and for example, may be made of a triple layer in which a first inorganic film, an organic film, and a second inorganic film may be sequentially positioned.

A common voltage supply line positioned in the non-display area will now be described according to an embodiment with reference to FIG. 9 to FIG. 19. The same constituent elements as the above-described constituent elements will be omitted.

Figure 9:
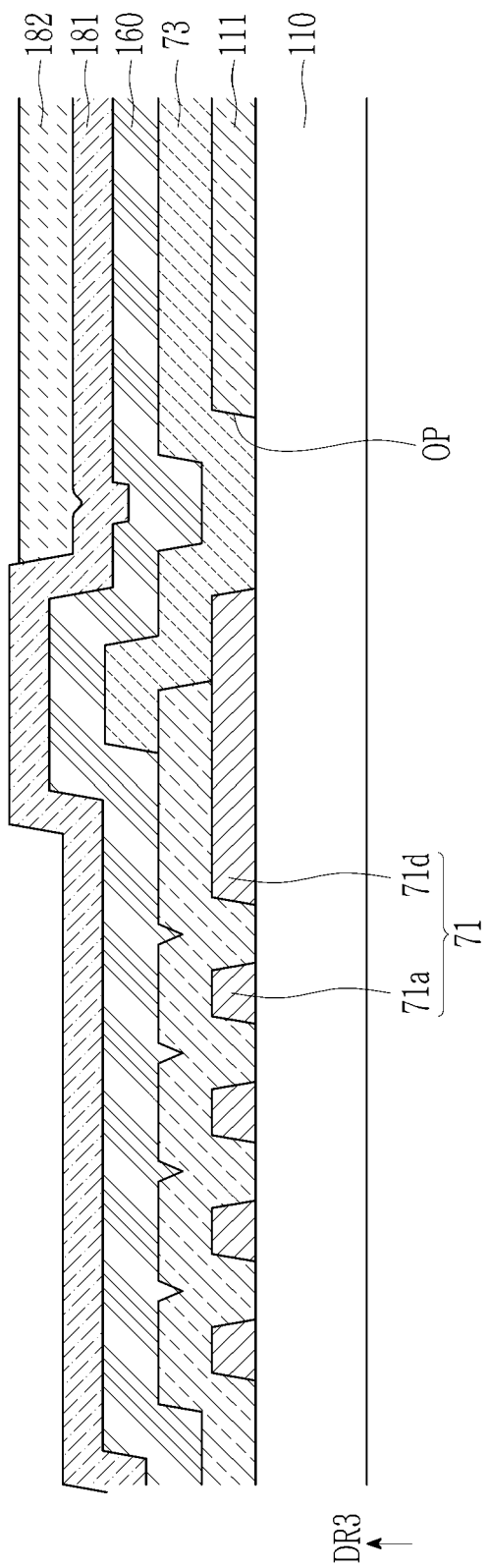
FIG. 9 schematically shows a cross-sectional view with respect to line D-D' of FIG. 3 according to an embodiment.
Figure 10:
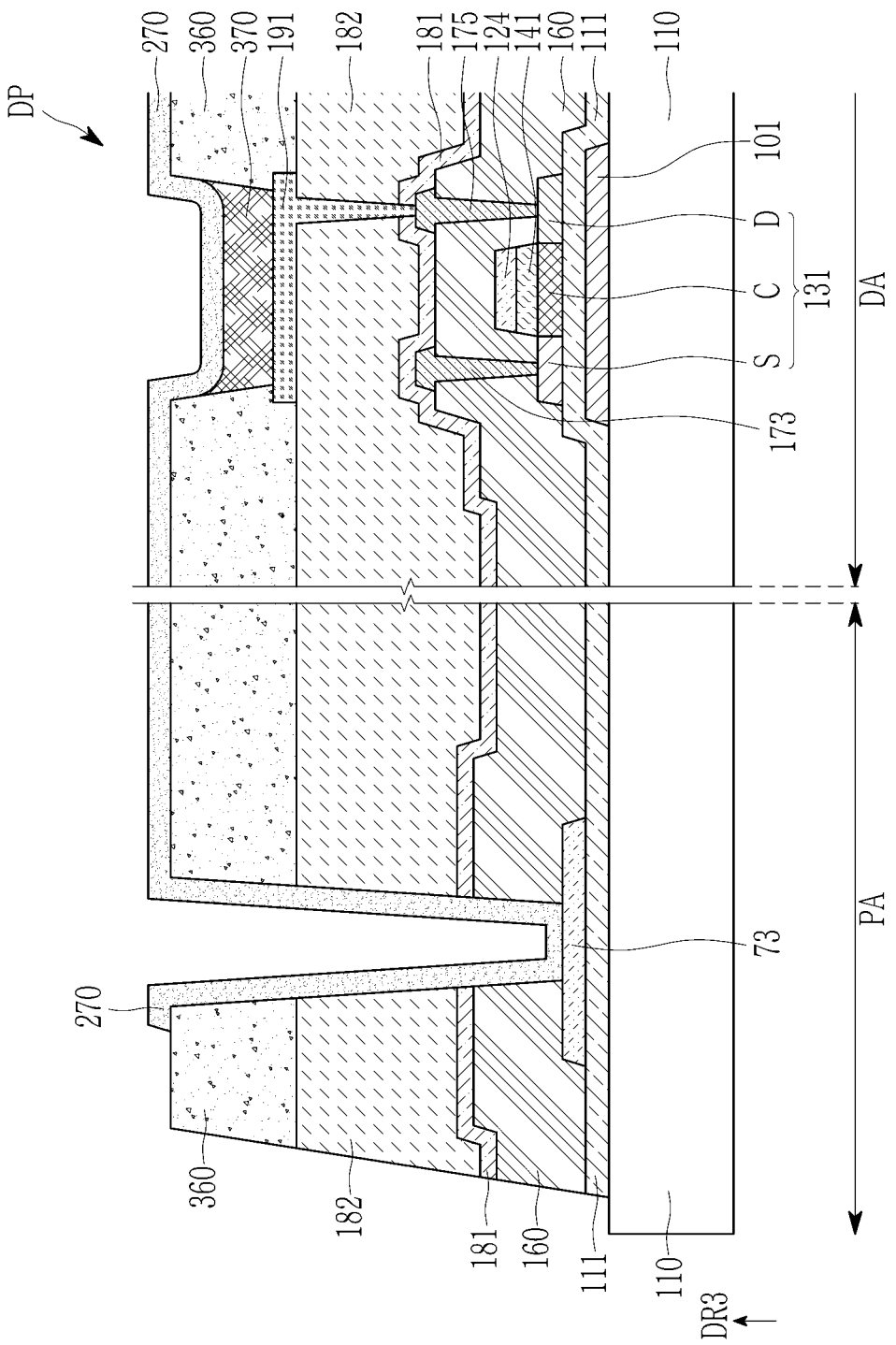
FIG. 10 schematically shows a cross-sectional view of a configuration for connecting a display area and a non-display area according to an embodiment of FIG. 9.

FIG. 9 schematically shows a cross-sectional view with respect to line D-D' of FIG. 3 according to an embodiment, and FIG. 10 schematically shows a cross-sectional view of a configuration for connecting a display area and a non-display area according to an embodiment of FIG. 9.

Referring to FIG. 9, a sub-supply line 71 according to an embodiment may be made of a single conductive layer. The sub-supply line 71 may include a first sub-supply line 71a positioned between the substrate 110 and the buffer layer 111. The sub-supply line 71 may extend in the first direction DR1, and may include an expansion 71d protruding in the second direction DR2.

The specification illustrates and describes an embodiment in which the sub-supply line 71 may be made of a single conductive layer, but is not limited thereto. The main supply line 70 and the anti-static pattern 72 may be formed into a single conductive layer in a like manner of the sub-supply line 71, or the main supply line 70 and the anti-static pattern 72 may be formed as double layers and the sub-supply line 71 may be formed as a single layer as described with reference to FIG. 3 to FIG. 7. For example, combinations with various configurations described in the specification are allowable.

The connection bridge 73 may be positioned on the buffer layer 111. The expansion 71d may be exposed by the opening OP. The expansion 71d may be electrically connected to the connection bridge 73 in the exposed region.

The sub-supply line 71 may be positioned on a same layer as the metal layer 101 positioned in the display area DA, and may include a same material. The sub-supply line 71 and the metal layer 101 may be formed according to a same process.

The connection bridge 73 may be positioned on a same layer as the gate electrode 124 positioned in the display area DA, and may include a same material. The connection bridge 73 and the gate electrode 124 may be formed according to a same process.

The inter-layer insulating layer 160 and the first insulating layer 181 may be sequentially stacked on each other on the sub-supply line 71. The inter-layer insulating layer 160, the first insulating layer 181, and the second insulating layer 182 may be sequentially stacked on each other on the connection bridge 73.

The second insulating layer 182 may be removed from the region in which the sub-supply line 71 may be positioned, so the path for moisture permeating from the outside to permeate into the display area may be blocked.

Referring to FIG. 10, the common electrode 270 positioned in the display area DA may extend to the non-display area PA and may be electrically connected to an end of the connection bridge 73 positioned on the buffer layer 111. The specification illustrates an embodiment in which the common electrode 270 may be directly connected to the connection bridge 73, and without being limited thereto, an additional connecting member may be further positioned between the common electrode 270 and the connection bridge 73.

Figure 11:
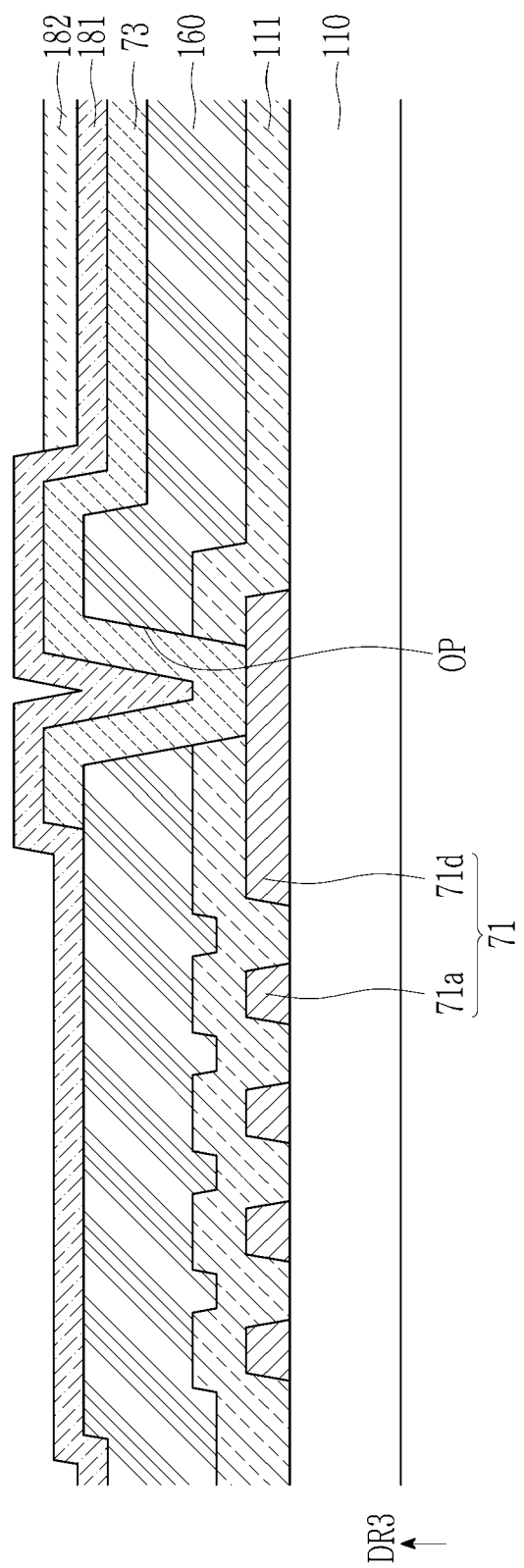
FIG. 11 schematically shows a cross-sectional view with respect to line D-D' of FIG. 3 according to an embodiment.

FIG. 11 schematically shows a cross-sectional view with respect to line D-D' of FIG. 3 according to an embodiment.

Referring to FIG. 11, the sub-supply line 71 may be made as a single conductive layer. The sub-supply line 71 may include a first sub-supply line 71a positioned between the substrate 110 and the buffer layer 111. The sub-supply line 71 may extend in the first direction DR1, and may include an expansion 71d protruding in the second direction DR2.

A buffer layer 111 and an inter-layer insulating layer 160 may be positioned on the sub-supply line 71. The connection bridge 73 may be positioned on the inter-layer insulating layer 160. The expansion 71d may be exposed by the opening OP. The expansion 71d may be electrically connected to the connection bridge 73 in the exposed region.

The sub-supply line 71 may be positioned on a same layer as the metal layer 101 positioned in the display area DA, and may include a same material. The sub-supply line 71 and the metal layer 101 may be made according to a same process.

The connection bridge 73 may be positioned on a same layer as the source electrode 173 and the drain electrode 175 positioned in the display area DA, and may include a same material. The connection bridge 73, the source electrode 173, and the drain electrode 175 may be made according to a same process.

A first insulating layer 181 and a second insulating layer 182 may be positioned on the connection bridge 73. The first insulating layer 181 may overlap the sub-supply line 71, and may overlap the connection bridge 73. The second insulating layer 182 may not overlap the sub-supply line 71 but may overlap the connection bridge 73.

The second insulating layer 182 may be removed from the region in which the sub-supply line 71 may be positioned, so the path for moisture permeating from the outside to permeate into the display area may be blocked.

The connection bridge 73 may be connected to the common electrode 270 as shown in FIG. 8, of which redundant descriptions will be omitted.

Figure 12:
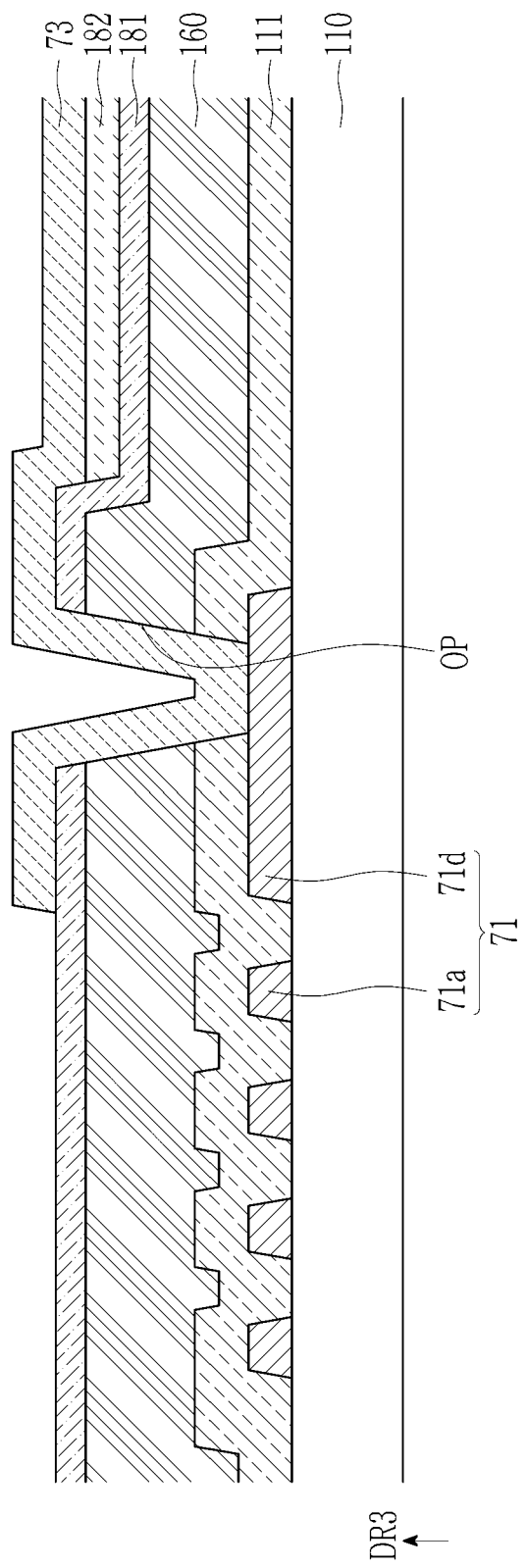
FIG. 12 schematically shows a cross-sectional view with respect to line D-D' of FIG. 3 according to an embodiment.
Figure 13:
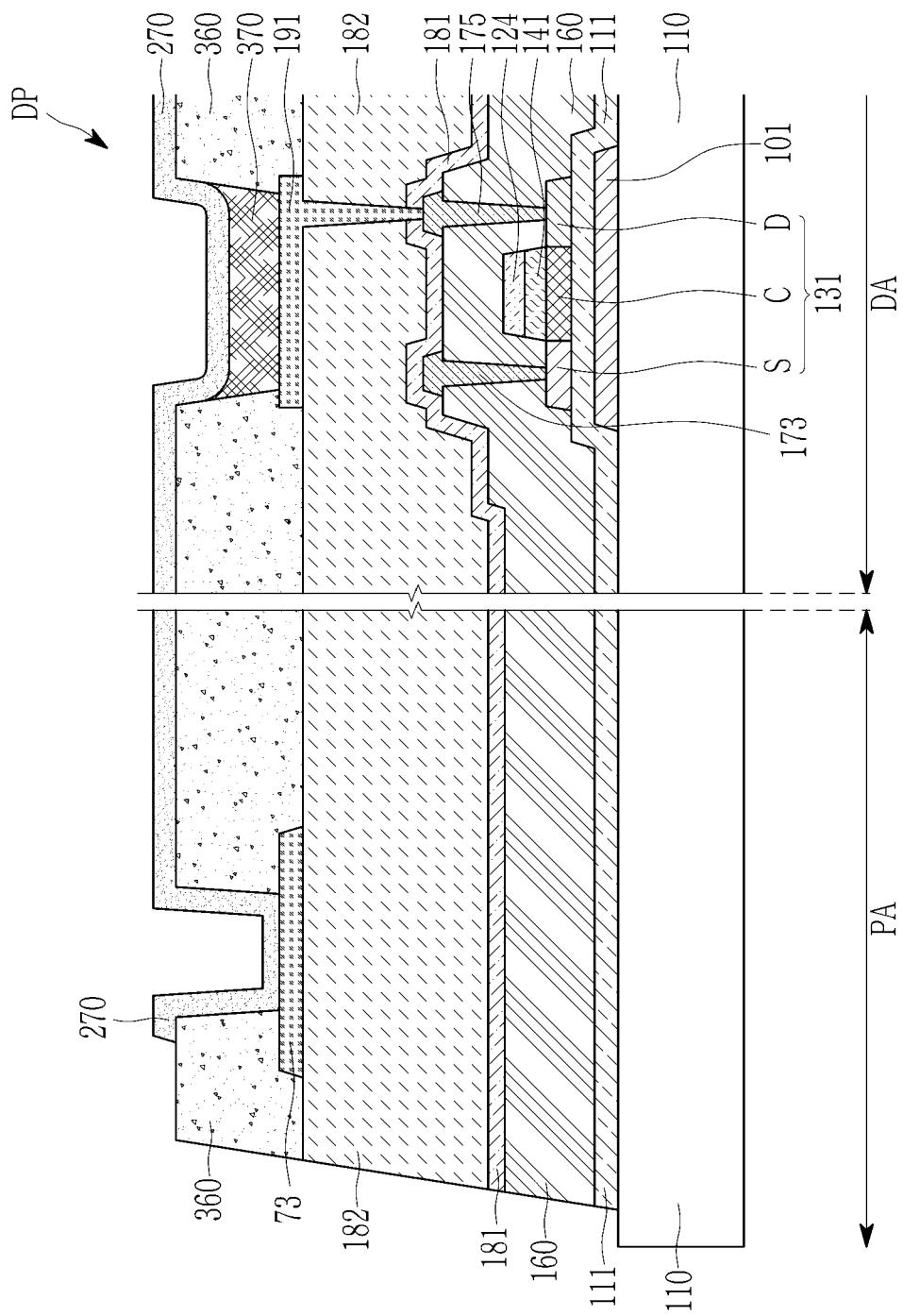
FIG. 13 schematically shows a cross-sectional view of a configuration for connecting a display area and a non-display area according to an embodiment of FIG. 12.

FIG. 12 schematically shows a cross-sectional view with respect to line D-D' of FIG. 3 according to an embodiment, and FIG. 13 schematically shows a cross-sectional view of a configuration for connecting a display area and a non-display area according to an embodiment of FIG. 12.

Referring to FIG. 12, the sub-supply line 71 may be made as a single conductive layer. The sub-supply line 71 may include a first sub-supply line 71a positioned between the substrate 110 and the buffer layer 111. The sub-supply line 71 may extend in the first direction DR1, and may include an expansion 71d protruding in the second direction DR2.

The sub-supply line 71 may be positioned on a same layer as the metal layer 101 positioned in the display area DA, and may include a same material. The sub-supply line 71 and the metal layer 101 may be made according to a same process.

A buffer layer 111, an inter-layer insulating layer 160, and a first insulating layer 181 may be positioned on the sub-supply line 71. A second insulating layer 182 may be positioned on part of the first insulating layer 181. The connection bridge 73 may be positioned on the first insulating layer 181 and the second insulating layer 182.

The expansion 71d may be exposed by the opening OP. The expansion 71d may be electrically connected to the connection bridge 73 in the exposed region.

The connection bridge 73 may be positioned on a same layer as the pixel electrode 191 positioned in the display area DA, and may include a same material. The connection bridge 73 and the pixel electrode 191 may be made according to a same process.

The first insulating layer 181 may overlap the sub-supply line 71, and may overlap the connection bridge 73. The second insulating layer 182 may not overlap the sub-supply line 71 but may overlap the connection bridge 73.

The second insulating layer 182 may be removed from the region in which the sub-supply line 71 may be positioned, so the path for moisture permeating from the outside to permeate into the display area may be blocked.

Referring to FIG. 13, the common electrode 270 positioned in the display area DA may extend to the non-display area PA and may be electrically connected to the connection bridge 73 positioned on the second insulating layer 182.

FIG. 14, FIG. 15, FIG. 16, FIG. 17, FIG. 18, and FIG. 19 schematically show a cross-sectional view with respect to line D-D' of FIG. 3 according to an embodiment.

Figure 14:
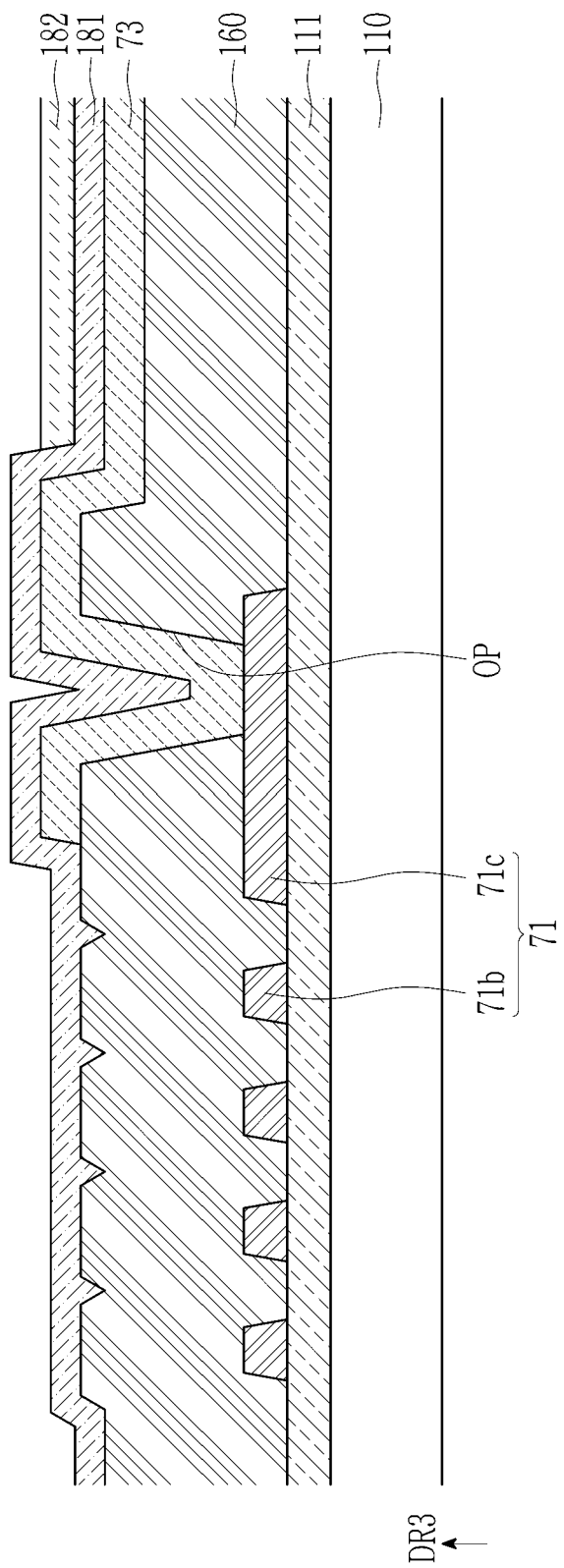
FIG. 14, FIG. 15, FIG. 16, FIG. 17, FIG. 18, and FIG. 19 schematically show a cross-sectional view with respect to line D-D' of FIG. 3 according to an embodiment.

Referring to FIG. 14, the sub-supply line 71 may be made as a single conductive layer. The sub-supply line 71 may include a second sub-supply line 71b positioned between the buffer layer 111 and the inter-layer insulating layer 160. The sub-supply line 71 may extend in the first direction DR1, and may include an expansion 71c protruding in the second direction DR2.

The sub-supply line 71 may be positioned on a same layer as the gate electrode 124 positioned in the display area DA, and may include a same material. The sub-supply line 71 and the gate electrode 124 may be made according to a same process.

An inter-layer insulating layer 160 may be positioned in the sub-supply line 71. The connection bridge 73 may be positioned on the inter-layer insulating layer 160. The expansion 71c may be exposed by the opening OP. The expansion 71c may be electrically connected to the connection bridge 73 in the exposed region.

The connection bridge 73 may be positioned on a same layer as the source electrode 173 and the drain electrode 175 positioned in the display area DA, and may include a same material. The connection bridge 73, the source electrode 173, and the drain electrode 175 may be made according to a same process.

A first insulating layer 181 and a second insulating layer 182 may be positioned on the connection bridge 73. The first insulating layer 181 may overlap the sub-supply line 71 and the connection bridge 73. The second insulating layer 182 may not overlap the sub-supply line 71 but may overlap the connection bridge 73.

The second insulating layer 182 may be removed from the region in which the sub-supply line 71 may be positioned, so the sub-supply line 71 may block the path for moisture permeating from the outside to permeate into the display area.

The connection bridge 73 may be connected to the common electrode 270 as shown in FIG. 8, of which redundant descriptions will be omitted.

Figure 15:
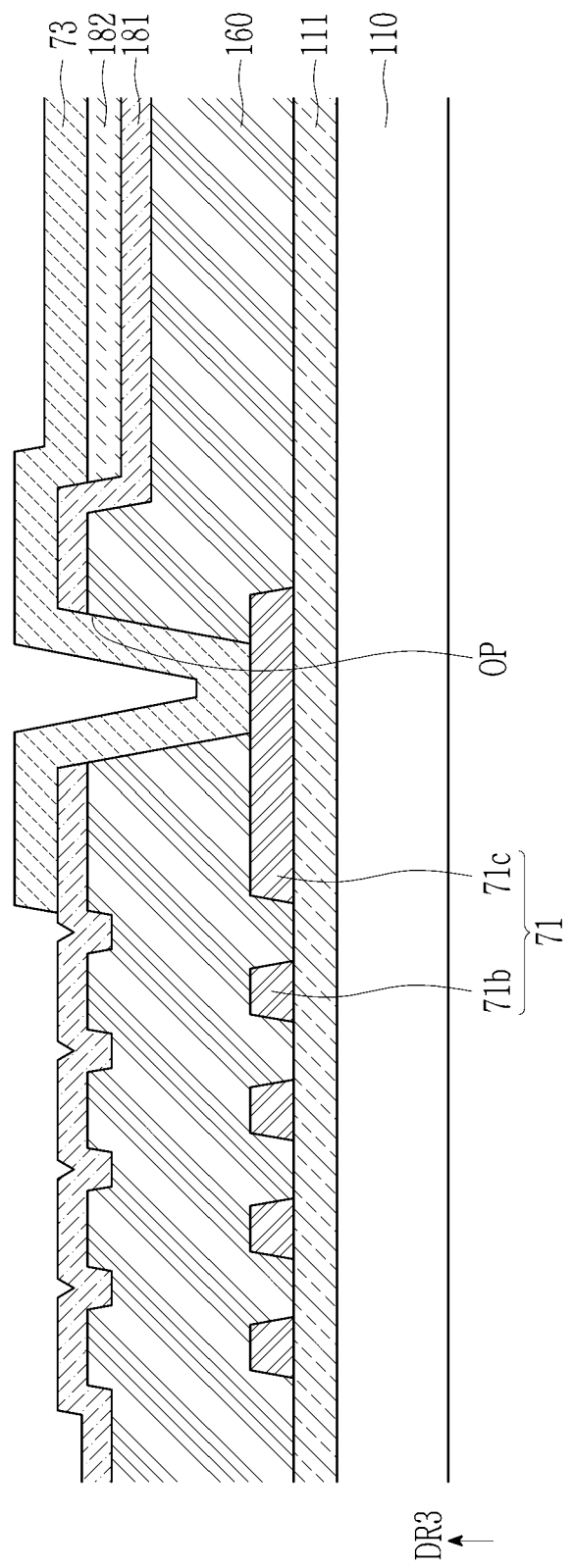

Referring to FIG. 15, the sub-supply line 71 may be made as a single conductive layer. The sub-supply line 71 may include a second sub-supply line 71b positioned between the buffer layer 111 and the inter-layer insulating layer 160. The sub-supply line 71 may extend in the first direction DR1, and may include an expansion 71c protruding in the second direction DR2.

The expansion 71c may be exposed by the opening OP. The expansion 71c may be electrically connected to the connection bridge 73 in the exposed region.

The sub-supply line 71 may be positioned on a same layer as the gate electrode 124 positioned in the display area DA, and may include a same material. The sub-supply line 71 and the gate electrode 124 may be made according to a same process.

An inter-layer insulating layer 160, a first insulating layer 181, and a second insulating layer 182 may be positioned in the sub-supply line 71. The connection bridge 73 may be positioned on the first insulating layer 181 and the second insulating layer 182.

The connection bridge 73 may be positioned on a same layer as the pixel electrode 191 positioned in the display area DA, and may have a same material. The connection bridge 73 and the pixel electrode 191 may be made according to a same process.

A buffer layer 111, an inter-layer insulating layer 160, a first insulating layer 181, and a connection bridge 73 may be sequentially stacked on each other in the region overlapping the sub-supply line 71. The buffer layer 111, the inter-layer insulating layer 160, the first insulating layer 181, the second insulating layer 182, and the connection bridge 73 may be sequentially stacked on each other in the region not overlapping the sub-supply line 71.

For example, the second insulating layer 182 may be removed from the region in which the sub-supply line 71 may be positioned, so the sub-supply line 71 may block the path for moisture permeating from the outside to permeate into the display area.

As shown in FIG. 13, the connection bridge 73 may be connected to the common electrode 270, and no redundant description thereof will be provided.

Figure 16:
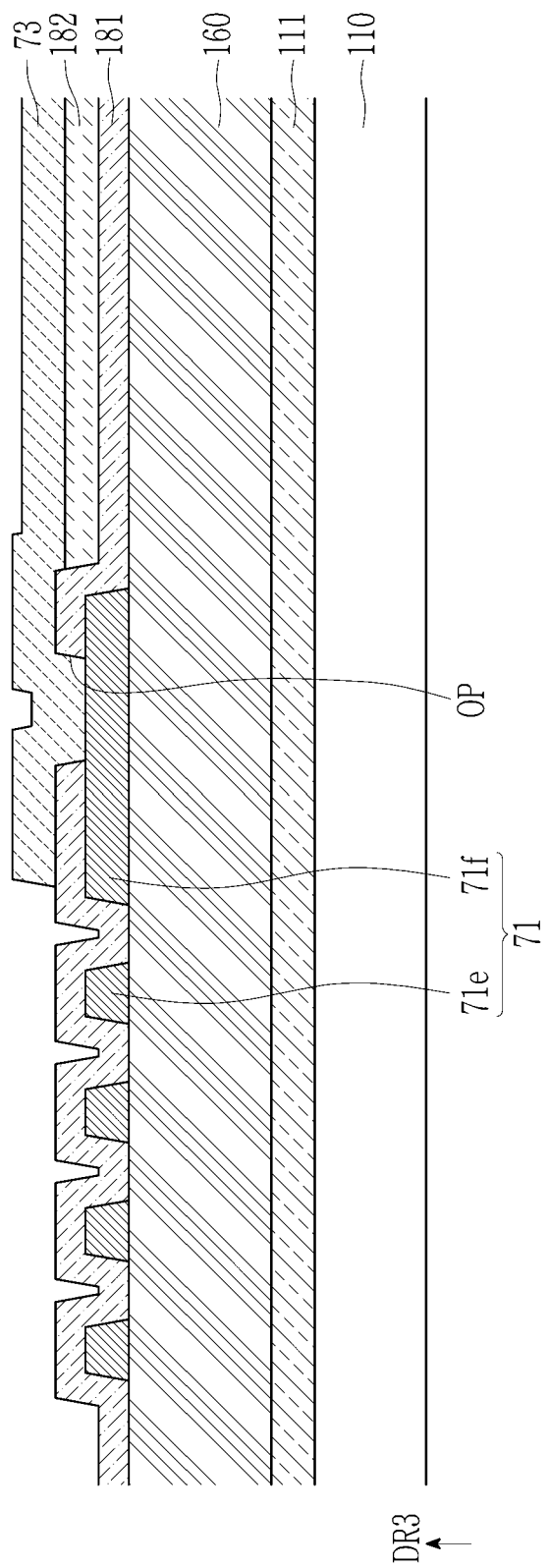

Referring to FIG. 16, the sub-supply line 71 may be made as a single conductive layer. The sub-supply line 71 may include a third sub-supply line 71e positioned between the inter-layer insulating layer 160 and the first insulating layer 181. The sub-supply line 71 may extend in the first direction DR1, and may include an expansion 71f protruding in the second direction DR2.

The sub-supply line 71 may be positioned on a same layer as the source electrode 173 and the drain electrode 175 positioned in the display area DA, and may include a same material. The sub-supply line 71, the source electrode 173, and the drain electrode 175 may be made according to a same process.

A first insulating layer 181 and, a second insulating layer 182 may be positioned on the connection bridge 73. The connection bridge 73 may be positioned on the first insulating layer 181 and the second insulating layer 182. The expansion 71f may be exposed by the opening OP. The expansion 71f may be electrically connected to the connection bridge 73 in the exposed region.

The connection bridge 73 may be positioned on a same layer as the pixel electrode 191 positioned in the display area DA, and may include a same material. The connection bridge 73 and the pixel electrode 191 may be made according to a same process.

The buffer layer 111, the inter-layer insulating layer 160, the sub-supply line 71, the first insulating layer 181, and the connection bridge 73 may be sequentially stacked on each other in the region overlapping the sub-supply line 71. The buffer layer 111, the inter-layer insulating layer 160, the first insulating layer 181, the second insulating layer 182, and the connection bridge 73 may be sequentially stacked on each other in the second region excluding the region overlapping the sub-supply line 71.

For example, the second insulating layer 182 may be removed from the region in which the sub-supply line 71 may be positioned, so the sub-supply line 71 may block the path for moisture permeating from the outside to permeate into the display area.

As shown in FIG. 13, the connection bridge 73 may be connected to the common electrode 270, and no redundant description thereof will be provided.

Figure 17:
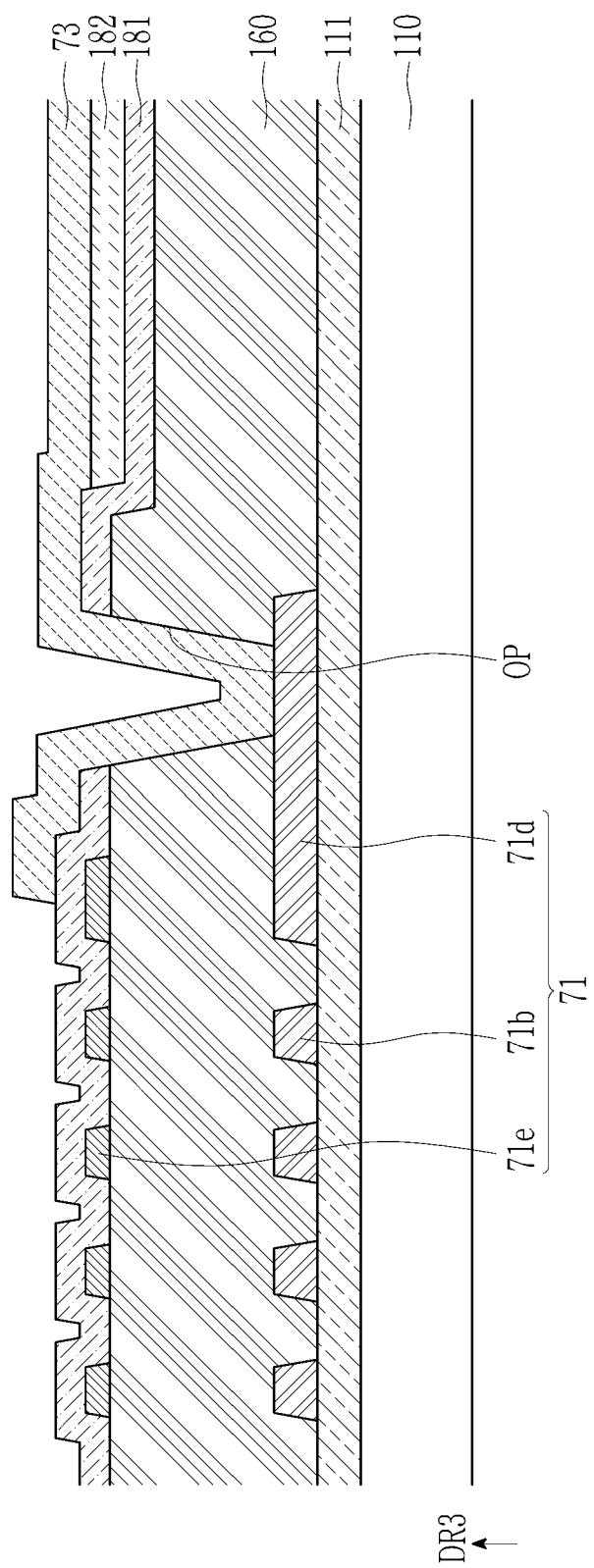

Referring to FIG. 17, the sub-supply line 71 may be a multi-layered wire made of double conductive layers. For example, the sub-supply line 71 may include a second sub-supply line 71b positioned on the buffer layer 111 and a third sub-supply line 71e positioned on the inter-layer insulating layer 160. The first sub-supply line 71b may include an expansion 71d, and the third sub-supply line 71e may include an expansion (not shown). The expansion 71d may be exposed by the opening OP and may be electrically connected to the connection bridge 73. The expansion (not shown) included by the third sub-supply line 71e may be exposed by the opening and may be electrically connected to the connection bridge.

The connection bridge 73 may be positioned on the first insulating layer 181 and the second insulating layer 182.

The second insulating layer 182 may not be positioned in the region in which the sub-supply line 71 may be positioned. The second insulating layer 182 may be removed from the region in which the sub-supply line 71 may be positioned, so the sub-supply line 71 may block the path for moisture permeating from the outside to permeate into the display area.

The sub-supply line 71 may include a second sub-supply line 71b positioned on a same layer as the gate electrode 124 positioned in the display area DA, and a third sub-supply line 71e positioned on a same layer as the source electrode 173 and the drain electrode 175. The connection bridge 73 may be positioned on a same layer as the pixel electrode 191 positioned in the display area DA.

As shown in FIG. 13, the connection bridge 73 may be connected to the common electrode 270, and no redundant description thereof will be provided.

Figure 18:
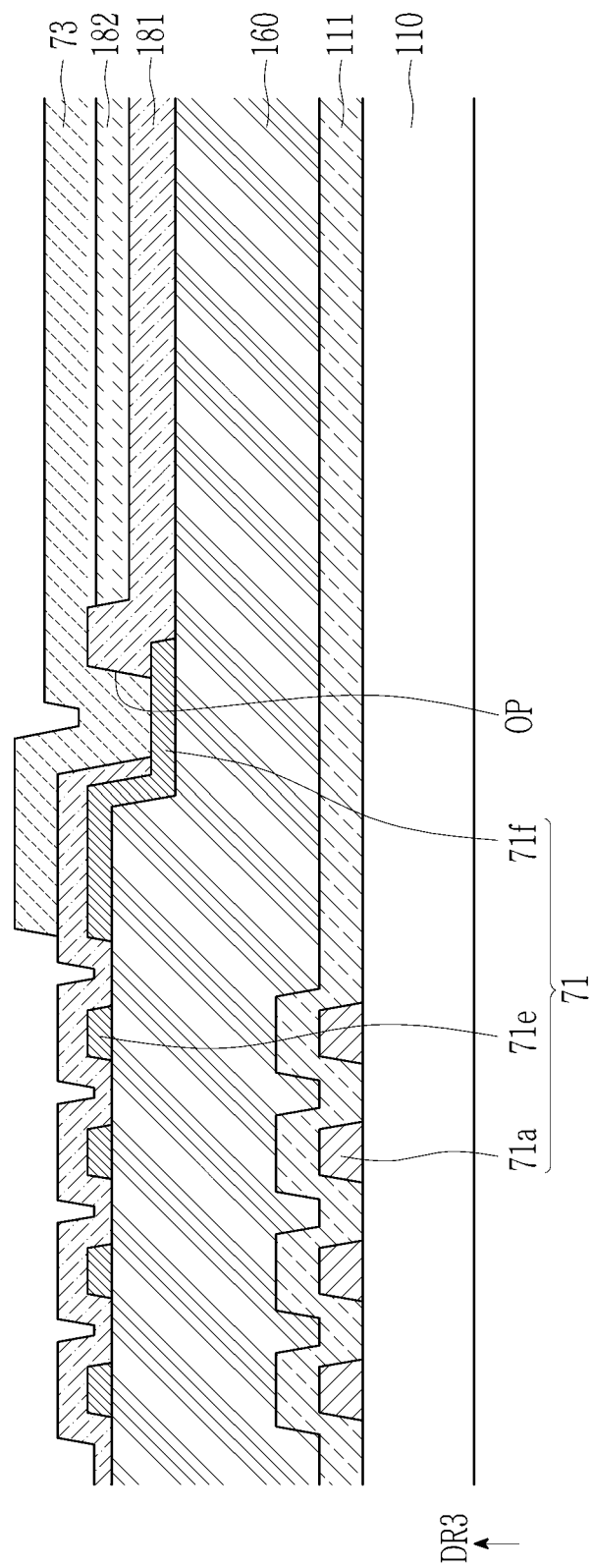

Referring to FIG. 18, the sub-supply line 71 may be a multi-layered wire made of double conductive layers. For example, the sub-supply line 71 may include a first sub-supply line 71a positioned between the substrate 110 and the buffer layer 111, and a third sub-supply line 71e positioned on the inter-layer insulating layer 160. The first sub-supply line 71a may include an expansion (not shown), and the third sub-supply line 71e may include an expansion 71f. The expansion 71f may be exposed by the opening OP and may be electrically connected to the connection bridge 73. The expansion (not shown) of the first sub-supply line 71a may also be exposed by the opening and may be electrically connected to the connection bridge 73.

The connection bridge 73 may be positioned on the first insulating layer 181 and the second insulating layer 182. The second insulating layer 182 may not be positioned in the region in which the sub-supply line 71 may be positioned. The second insulating layer 182 may be removed from the region in which the sub-supply line 71 may be positioned, so the sub-supply line 71 may block the path for moisture permeating from the outside to permeate into the display area.

The sub-supply line 71 may include a first sub-supply line 71a positioned on a same layer as the metal layer 101 positioned in the display area DA, and a third sub-supply line 71e positioned on a same layer as the source electrode 173 and the drain electrode 175. The connection bridge 73 may be positioned on a same layer as the pixel electrode 191 positioned in the display area DA.

As shown in FIG. 13, the connection bridge 73 may be connected to the common electrode 270, and no redundant description thereof will be provided.

Figure 19:
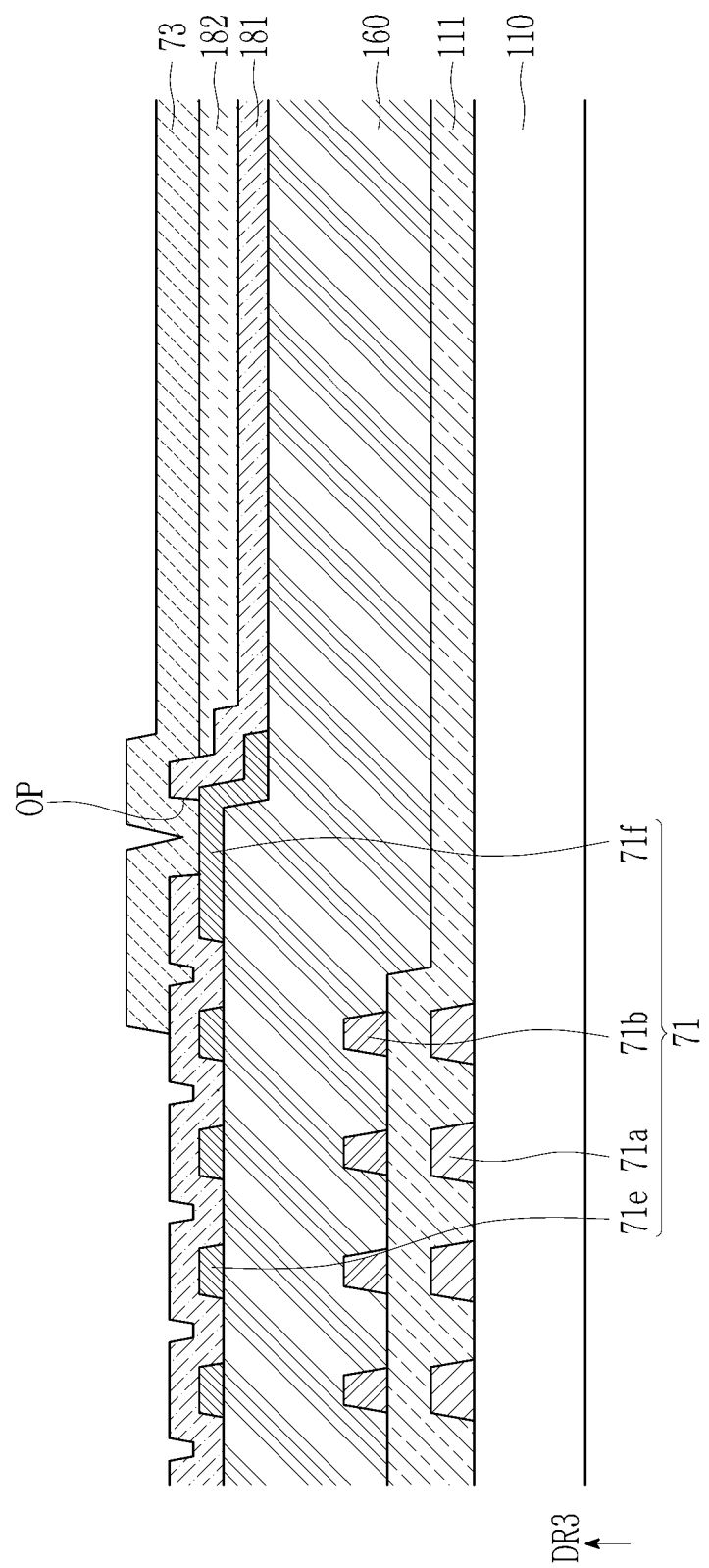

Referring to FIG. 19, the sub-supply line 71 may be a multi-layered wire made of triple conductive layers. For example, the sub-supply line 71 may include a first sub-supply line 71a positioned between the substrate 110 and the buffer layer 111, a second sub-supply line 71b positioned between the buffer layer 111 and the inter-layer insulating layer 160, and a third sub-supply line 71e positioned on the inter-layer insulating layer 160. The first sub-supply line 71a may include an expansion (not shown), the second sub-supply line 71b may include an expansion (not shown), and the third sub-supply line 71e may include an expansion 71f. The respective expansions 71f may be exposed by the opening OP and may be electrically connected to the connection bridge 73.

The connection bridge 73 may be positioned on the first insulating layer 181 and the second insulating layer 182. The second insulating layer 182 may not be positioned in the region in which the sub-supply line 71 may be positioned. The second insulating layer 182 may be removed from the region in which the sub-supply line 71 may be positioned, so the sub-supply line 71 may block the path for moisture permeating from the outside to permeate into the display area.

The sub-supply line 71 may include a first sub-supply line 71a positioned on a same layer as the metal layer 101 positioned in the display area DA, a second sub-supply line 71b positioned on a same layer as the gate electrode 124, and a third sub-supply line 71e positioned on a same layer as the source electrode 173 and the drain electrode 175. The connection bridge 73 may be positioned on a same layer as the pixel electrode 191 positioned in the display area DA.

As shown in FIG. 13, the connection bridge 73 may be connected to the common electrode 270, and no redundant description thereof will be provided.

According to embodiments, a sub-supply line 71 connects a spaced main supply line 70 and allows a common voltage supply line to form a closed loop. In this instance, a second insulating layer on which moisture moves may be removed from the region in which the sub-supply line 71 may be positioned. Therefore, a path for moisture input from the outside to move may be blocked by the sub-supply line 71, thereby providing the display device with improved reliability.

While this disclosure has been described in connection with what is considered to be practical embodiments, it is to be understood that the disclosure is not limited to the disclosed embodiments. Rather, the disclosure is intended to include various modifications and equivalent arrangements, including those included within the spirit and scope of the appended claims and equivalents thereof.

What is claimed is:

1. A display device comprising:
   a substrate including a display area and a non-display area;
   a light-emitting element disposed in the display area; and
   a common voltage supply line disposed in the non-display area and electrically connected to the light-emitting element; and
   a data driver disposed in the non-display area,
   wherein the common voltage supply line includes:
     at least two main supply lines;
     a sub-supply line electrically connecting the at least two main supply lines; and
     at least one anti-static pattern disposed outside the sub-supply line in a plan view, wherein
   the sub-supply line is disposed between the display area and each of the at least one anti-static pattern,
   a width of each of the main supply lines is greater than a width of the sub-supply line in a plan view, and
   a direction of the width of each of the main supply lines is perpendicular to a direction of the width of the sub-supply line,
   wherein the non-display area comprises a first non-display area and a second non-display area, and the first non-display area and the second non-display area are positioned with the display area in between, the data driver is disposed in the first non-display area, and the anti-static pattern and the sub-supply line are positioned in the second non-display area.

2. The display device of claim 1, wherein
   the at least one anti-static pattern includes a plurality of anti-static patterns, and
   the plurality of anti-static patterns are disposed in a first direction.

3. The display device of claim 2, wherein
   the plurality of anti-static patterns are spaced apart from each other, and
   the at least two main supply lines, the sub-supply line, and the plurality of anti-static patterns are formed from a same layer and are comprised of a same material.

4. The display device of claim 2, wherein
   the common voltage supply line includes a connection bridge electrically connected to a common electrode of the light-emitting element, and
   the at least two main supply lines, the sub-supply line, and the plurality of anti-static patterns each have a mesh shape in a plan view.

5. The display device of claim 4, wherein
   the connection bridge is electrically connected to the sub-supply line and the plurality of anti-static patterns, and
   the at least two main supply lines, the sub-supply line, and the plurality of anti-static patterns each comprise a metal layer formed as a double layer.

6. The display device of claim 4, wherein
   each of the sub-supply line and the at least one anti-static pattern includes an expansion connected to the connection bridge,
   the at least two main supply lines, the sub-supply line, and the plurality of anti-static patterns each comprise a metal layer disposed as a double layer that includes a first layer and a second layer, and an insulating layer is disposed between the first layer and the second layer of the double layer.

7. The display device of claim 2, further comprising:
a pad portion disposed at one end of the display device, the pad portion including a plurality of terminals, the at least two main supply lines extending from ones of the plurality of terminals; and
a controller electrically connected to the pad portion, the controller to transmit a common voltage to the common voltage supply line via the terminals, wherein
the at least two main supply lines are spaced in the first direction, and
the sub-supply line extends in the first direction and electrically connects the at least two main supply lines.

8. The display device of claim 1, wherein the sub-supply line and each of the at least two main supply lines form a same electrical node.

9. The display device of claim 1, wherein the sub-supply line and each of the at least two main supply lines are held at a same electrical potential.

10. The display device of claim 1, wherein the sub-supply line directly contacts each of the at least two main supply lines.

11. A display device comprising:
a substrate including a display area and a non-display area;
a light-emitting element disposed in the display area;
a common voltage supply line disposed in the non-display area and electrically connected to the light-emitting element, wherein the common voltage supply line includes:
at least two main supply lines;
a sub-supply line for connecting the at least two main supply lines; and
at least one anti-static pattern disposed outside the sub-supply line in a plan view; and
a buffer layer, an inter-layer insulating layer, a first insulating layer, and a second insulating layer sequentially disposed on the substrate, wherein
the at least one anti-static pattern includes a plurality of anti-static patterns, and
the plurality of anti-static patterns are disposed in a first direction
the first insulating layer forms a valley between one of the at least two main supply lines and one of the plurality of anti-static patterns, and
the second insulating layer fills the valley.

12. The display device of claim 11, further comprising:
a first region overlapping the main supply line, the sub-supply line, and the anti-static pattern; and
a second region,
wherein the first region does not overlap the second insulating layer.

13. The display device of claim 12, wherein the connection bridge overlaps the second insulating layer in the second region.

14. The display device of claim 11, wherein the sub-supply line includes at least one of:
a first sub-supply line between the substrate and the buffer layer;
a second sub-supply line between the buffer layer and the inter-layer insulating layer; and
a third sub-supply line between the inter-layer insulating layer and the first insulating layer.

15. The display device of claim 14, further comprising:
a metal layer disposed on the substrate;
a gate electrode disposed on the buffer layer; and
a source electrode and a drain electrode disposed on the inter-layer insulating layer, wherein
the first sub-supply line and the metal layer are disposed on a same layer,
the second sub-supply line and the gate electrode are disposed on a same layer, and
the third sub-supply line, the source electrode, and the drain electrode are disposed on a same layer.

16. A display device comprising:
a substrate including a display area and a non-display area;
a light-emitting element disposed in the display area and electrically connected to a thin film transistor;
an insulating layer disposed between the thin film transistor and the light-emitting element in a cross-sectional view;
a data driver disposed in the non-display area; and
a common voltage supply line disposed in the non-display area and electrically connected to the light-emitting element, wherein
the common voltage supply line includes:
at least twos main supply lines;
a sub-supply line electrically connected to each of the at least two main supply lines; and
at least one anti-static pattern disposed outside the sub-supply line in a plan view, wherein
the insulating layer is spaced apart from each of the at least two main supply line, the sub-supply line, and the at least one anti-static pattern in a plan view,
the at least one anti-static pattern being disposed further from the display area than the sub-supply line, and
a width of each of the main supply lines is greater than a width of the sub-supply line in a plan view,
a direction of the width of each of the main supply lines and a direction of the width of the sub-supply line are perpendicular to both a thickness direction of the display device and perpendicular to a longest dimension of the main supply lines and a longest direction of the sub-supply line, respectively, and
wherein the non-display area comprises a first non-display area and a second non-display area, and the first non-display area and the second non-display area are positioned with the display area in between, the data driver is disposed in the first non-display area, and the anti-static pattern and the sub-supply line are positioned in the second non-display area.

17. The display device of claim 16, wherein the insulating layer does not overlap the main supply lines, the sub-supply line, and the at least one anti-static pattern.

18. The display device of claim 17, wherein
the at least two main supply lines are spaced apart in a first direction and extend in a second direction perpendicular to the first direction,
the common voltage supply line includes:
a sub-supply line extending in the first direction and electrically connecting the at least two main supply lines.

19. The display device of claim 18, further comprising a buffer layer, an inter-layer insulating layer, a first insulating layer, and a second insulating layer sequentially disposed on the substrate,
wherein the sub-supply line includes at least one of:
a first sub-supply line between the substrate and the buffer layer;
a second sub-supply line between the buffer layer and the inter-layer insulating layer; and a third sub-supply line between the inter-layer insulating layer and the first insulating layer.

20. The display device of claim 19, wherein the connection bridge is disposed at a layer higher than the sub-supply line.

21. The display device of claim 16, wherein the at least one anti-static pattern includes a plurality of anti-static patterns spaced apart from each other.

22. The display device of claim 16, wherein the common voltage supply line includes a connection bridge electrically connected to a common electrode of the light-emitting element.

23. The display device of claim 22, wherein the connection bridge is electrically connected to the sub-supply line and the plurality of anti-static patterns.

24. The display device of claim 16, wherein
the insulating layer is disposed on opposing sides of the sub-supply line, and
the insulating layer is disposed between neighboring ones of the at least one anti-static pattern, between the at least one anti-static pattern and ones of the main supply lines, and between the sub-supply line and the at least one anti-static pattern.

\* \* \* \* \*